(12) United States Patent
Lee

(10) Patent No.: US 11,963,351 B2
(45) Date of Patent: Apr. 16, 2024

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 317 days.

(21) Appl. No.: 17/328,355

(22) Filed: May 24, 2021

(65) Prior Publication Data

US 2022/0157849 A1 May 19, 2022

(30) Foreign Application Priority Data

Nov. 18, 2020 (KR) .......................... 10-2020-0154983

(51) Int. Cl.
| | |
|---|---|
| *H10B 43/27* | (2023.01) |
| *H01L 21/764* | (2006.01) |
| *H01L 21/78* | (2006.01) |
| *H10B 41/10* | (2023.01) |
| *H10B 41/27* | (2023.01) |
| *H10B 43/10* | (2023.01) |

(52) U.S. Cl.
CPC ............ *H10B 43/27* (2023.02); *H01L 21/764* (2013.01); *H01L 21/78* (2013.01); *H10B 41/10* (2023.02); *H10B 41/27* (2023.02); *H10B 43/10* (2023.02)

(58) Field of Classification Search
CPC ........ H10B 43/10; H10B 43/27; H10B 43/35; H10B 43/40; H10B 41/10; H10B 41/27; H10B 41/35; H10B 41/40; H01L 21/78; H01L 21/764; H01L 21/7682; H01L 23/562

See application file for complete search history.

(56) References Cited

U.S. PATENT DOCUMENTS

| | | | |
|---|---|---|---|
| 5,614,445 A | 3/1997 | Hirabayashi | |
| 7,435,606 B2 | 10/2008 | Lee et al. | |
| 10,950,621 B2* | 3/2021 | Ono | H10B 43/27 |
| 11,069,631 B2* | 7/2021 | Onuma | H01L 23/585 |
| 2014/0042595 A1* | 2/2014 | Schulze | B24B 7/228 |
| | | | 438/460 |
| 2014/0284683 A1* | 9/2014 | Ito | H10B 41/35 |
| | | | 257/316 |
| 2016/0071872 A1* | 3/2016 | Saito | H01L 21/76224 |
| | | | 257/314 |

(Continued)

FOREIGN PATENT DOCUMENTS

| | | |
|---|---|---|
| KR | 100988403 B1 | 10/2010 |
| KR | 101581431 B1 | 12/2015 |

*Primary Examiner* — Alia Sabur
(74) *Attorney, Agent, or Firm* — WILLIAM PARK & ASSOCIATES LTD.

(57) ABSTRACT

The present disclosure relates to a semiconductor memory device and a manufacturing method of the semiconductor memory device. A semiconductor memory device includes a gate stacked structure, a channel layer passing through the gate stacked structure in a vertical direction, a memory layer disposed between the channel layer and the gate stacked structure, a dummy stacked structure extended toward the gate stacked structure, a first dummy pattern passing through the dummy stacked structure in the vertical direction, and a gap arranged in the first dummy pattern.

14 Claims, 24 Drawing Sheets

(56) References Cited

U.S. PATENT DOCUMENTS

| | | | |
|---|---|---|---|
| 2016/0254053 A1* | 9/2016 | Takayama | H01L 29/518 |
| | | | 365/185.17 |
| 2016/0268166 A1 | 9/2016 | Nakajima | |
| 2020/0328180 A1* | 10/2020 | Cheng | H01L 21/78 |
| 2021/0005629 A1* | 1/2021 | Lim | G11C 7/18 |
| 2021/0020501 A1* | 1/2021 | Ono | H01L 21/02164 |
| 2021/0143096 A1* | 5/2021 | Yun | H01L 25/18 |
| 2021/0217768 A1* | 7/2021 | Fukuzumi | H01L 21/76877 |
| 2021/0313246 A1* | 10/2021 | Matsumura | H10B 43/40 |
| 2022/0157849 A1* | 5/2022 | Lee | H10B 43/40 |
| 2022/0319924 A1* | 10/2022 | Park | H01L 21/78 |
| 2022/0352023 A1* | 11/2022 | Yeom | H10B 43/27 |
| 2023/0260845 A1* | 8/2023 | Kweon | H01L 21/823475 |
| | | | 257/777 |

* cited by examiner

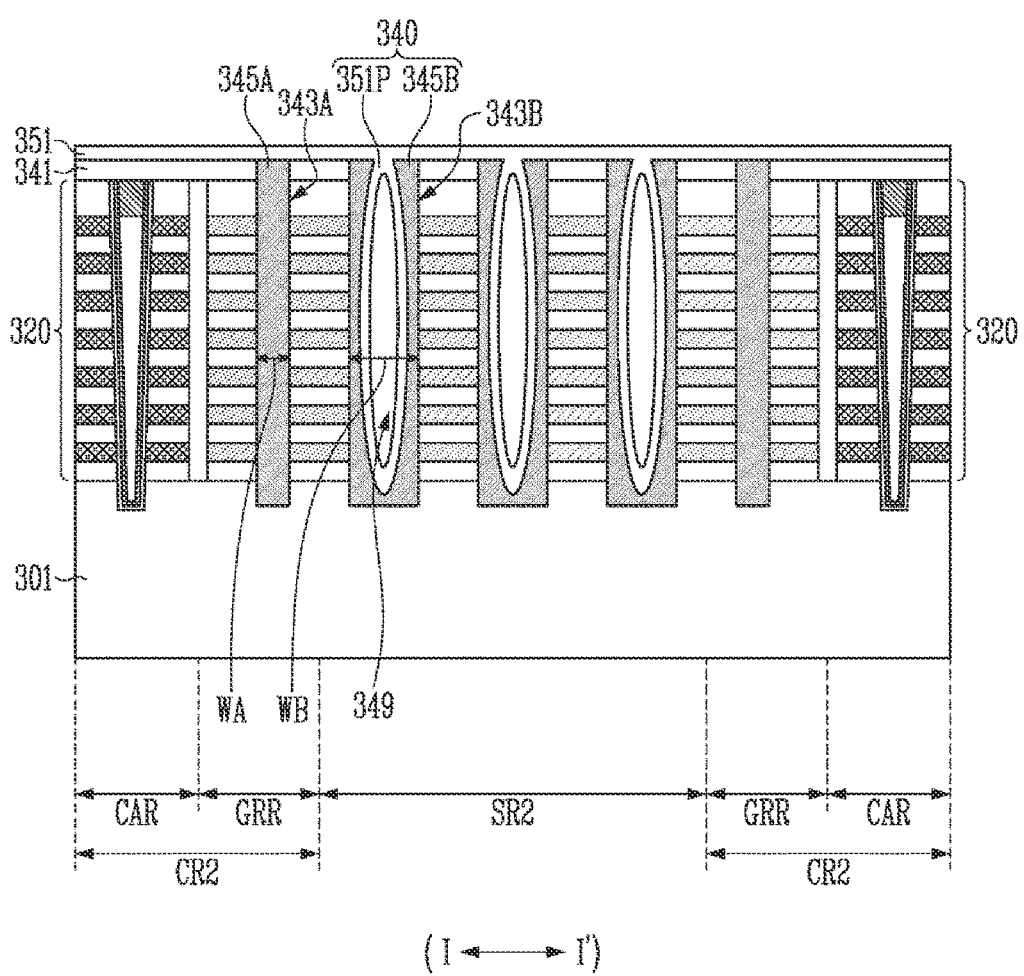

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2020-0154983 filed on Nov. 18, 2020, in the Korean Intellectual Property Office, the entire disclosure of which is incorporated by reference herein.

BACKGROUND

1. Technical Field

Various embodiments may relate generally to a semiconductor memory device and a manufacturing method of a semiconductor memory device, and more particularly, to a three-dimensional semiconductor memory device and a manufacturing method of a three-dimensional semiconductor memory device.

2. Related Art

Semiconductor memory devices may include a plurality of memory cells that store data. Three-dimensional semiconductor memory devices in which memory cells are three-dimensionally arranged on a substrate have been proposed to increase the integration density of semiconductor memory devices. The integration density of three-dimensional semiconductor memory devices may be improved by increasing the number of memory cells stacked on top of each other.

SUMMARY

According to an embodiment, a semiconductor memory device may include a gate stacked structure, a channel layer passing through the gate stacked structure in a vertical direction, a memory layer disposed between the channel layer and the gate stacked structure, a dummy stacked structure extended toward the gate stacked structure, a first dummy pattern passing through the dummy stacked structure in the vertical direction, and a gap arranged in the first dummy pattern.

According to an embodiment, a semiconductor memory device may include a substrate including a chip region and a scribe region, a gate stacked structure including interlayer insulating layers and conductive patterns stacked alternately on the substrate in the chip region, a channel layer passing through the gate stacked structure, a memory layer disposed between the channel layer and the gate stacked structure, a dummy stacked structure including first material layers and second material layers stacked alternately on the substrate in the scribe region, a dummy pattern passing through the dummy stacked structure, and a gap arranged in the dummy pattern.

According to an embodiment, a method of manufacturing a semiconductor memory device may include stacking first material layers and second material layers alternately on a support substrate including a chip region and a scribe region, forming a dummy groove passing through the first material layers and the second material layers to expose the support substrate in the scribe region, forming a dummy pattern in the dummy groove to define a gap in a central area of the dummy groove, removing the support substrate, and cutting the first material layers and the second material layers into chip patterns along the gap.

BRIEF DESCRIPTION OF THE DRAWINGS

FIGS. 10A, 10B, 10C, 10D, 10E, and 10F are cross-sectional diagrams illustrating a method of manufacturing a second circuit structure according to an embodiment of the present disclosure;

DETAILED DESCRIPTION

Specific structural or functional descriptions disclosed herein are merely illustrative for the purpose of describing embodiments according to the concept of the present disclosure. The embodiments according to the concept of the present disclosure can be implemented in various forms, and should not be construed as being limited to the specific embodiments set forth herein.

Hereinafter, the terms 'first' and 'second' are used to distinguish one component from another component. The terms may be used to describe various components, but the components are not limited by the terms.

Various embodiments may be directed to a semiconductor memory device capable of improving stability of manufacturing processes and a manufacturing method of the semiconductor memory device.

Figure 1:
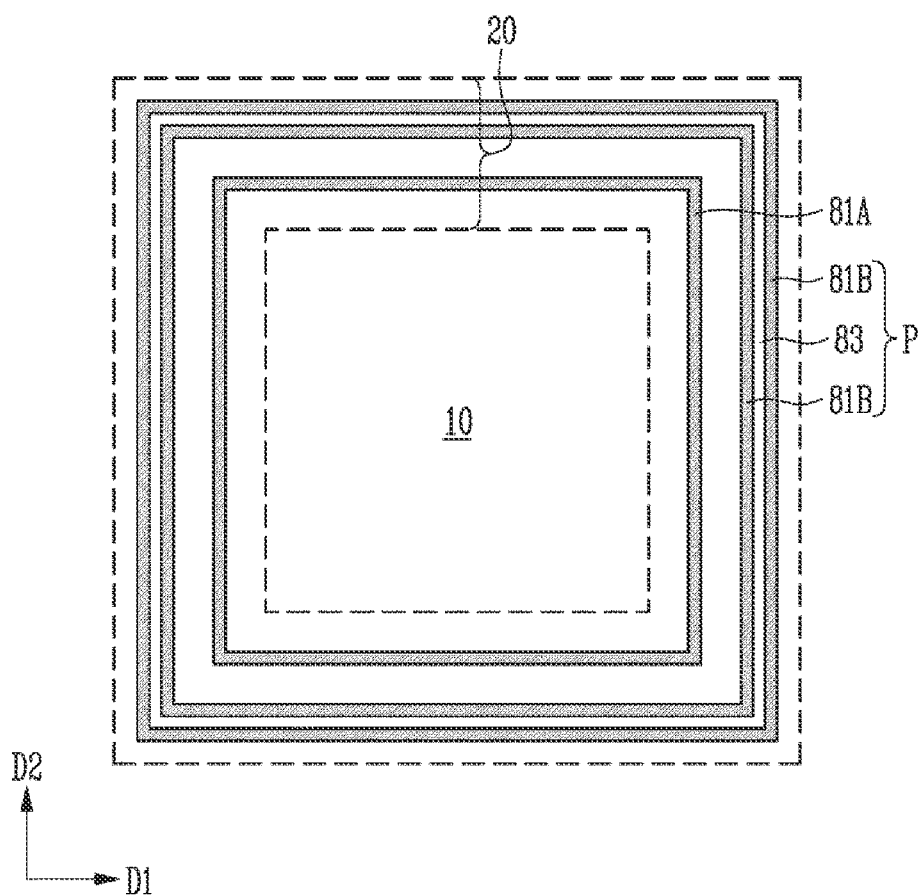
FIG. 1 is a schematic plan view illustrating a semiconductor memory device according to an embodiment of the present disclosure.

FIG. 1 is a schematic plan view illustrating a semiconductor memory device according to an embodiment of the present disclosure.

Referring to FIG. 1, a semiconductor memory device may include a circuit region 10 and an edge region 20. The edge region 20 may extend from the circuit region 10 to surround the circuit region 10.

A memory cell array and a peripheral circuit structure may be disposed in the circuit region 10. The memory cell array may include a three-dimensional memory cell array. Examples of the three-dimensional memory cell array may include a NAND flash memory, a Resistive Random Access Memory (RRAM), a Dynamic Random Access Memory (DRAM), a Static Random Access Memory (SRAM), and the like. Hereinafter, embodiments of the present disclosure will be described based on a memory cell array including a three-dimensional NAND flash memory, but they are not limited thereto. The peripheral circuit structure may be configured to control the operations of the memory cell array.

A chip guard pattern 81A and a dummy pattern P may be disposed in the edge region 20. The chip guard pattern 81A and the dummy pattern P may extend along the edge region 20 in a first direction D1 and a second direction D2. In an embodiment, the chip guard pattern 81A and the dummy pattern P may extend substantially in parallel with each other. The dummy pattern P may include an insulating layer 83 and a metal layer 81B. In an embodiment, the dummy pattern P may include an insulating layer 83 and one or more metal layers 81B. Embodiments of the dummy pattern P and the chip guard pattern 81A will be described below with reference to FIG. 3.

Figure 2:
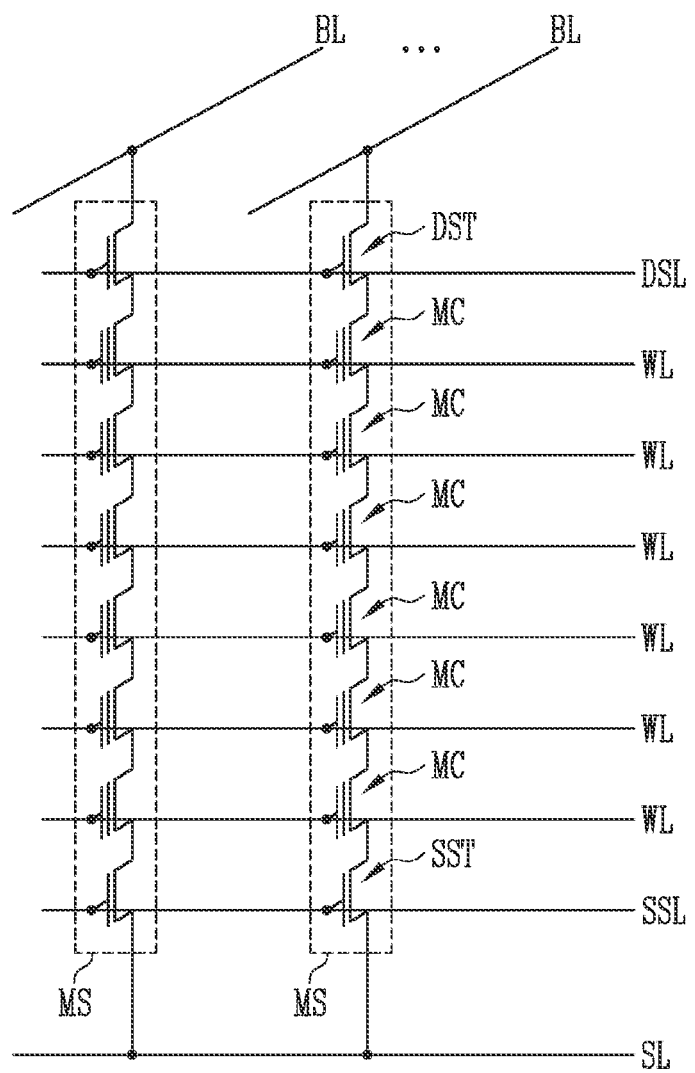
FIG. 2 is a circuit diagram illustrating a memory cell array according to an embodiment of the present disclosure.

FIG. 2 is a circuit diagram illustrating a memory cell array according to an embodiment of the present disclosure.

Referring to FIG. 2, a memory cell array may include a plurality of memory cell strings MS that are coupled to a source layer SL and a plurality of bit lines BL.

Each of the memory cell strings MS may include a plurality of memory cells MC, at least one source select transistor SST, and at least one drain select transistor DST which are coupled in series with each other. According to an embodiment, each of the memory cell strings MS may include one source select transistor SST which are coupled between the plurality of memory cells MC and the source layer SL. According to another embodiment, each of the memory cell strings MS may include two or more source select transistors SST which are coupled in series between the plurality of memory cells MC and the source layer SL. According to an embodiment, each of the memory cell strings MS may include one drain select transistor DST which is coupled between the plurality of memory cells MC and the bit line BL. According to another embodiment, each of the memory cell strings MS may include two or more drain select transistors DST which are coupled in series between the plurality of memory cells MC and the bit line BL.

The plurality of memory cells MC may be connected to the source layer SL through the source select transistor SST. The plurality of memory cells MC may be connected to the bit line BL through the drain select transistors DST.

Gates of the source select transistors SST that are located at the same level may be coupled to a source select line SSL. Gates of the drain select transistors DST that are located at the same level may be coupled to drain select lines DSL. Gates of the memory cells MC may be coupled to a plurality of word lines WL, respectively. The word lines WL may be arranged in different levels, and gates of the memory cells MC arranged at the same level may be coupled to a single word line WL.

The memory cell strings MS connected to a single drain select line DSL may be connected to different bit lines BL, respectively.

The source select line SSL, the word lines WL and the drain select line DSL of the three-dimensional semiconductor memory device may be realized by conductive patterns of a gate stacked structure. The plurality of memory cells MC, the source select transistor SST and the drain select transistor DST of the three-dimensional semiconductor memory device may be coupled in series with each other by a channel structure that passes through the gate stacked structure.

Figure 3:
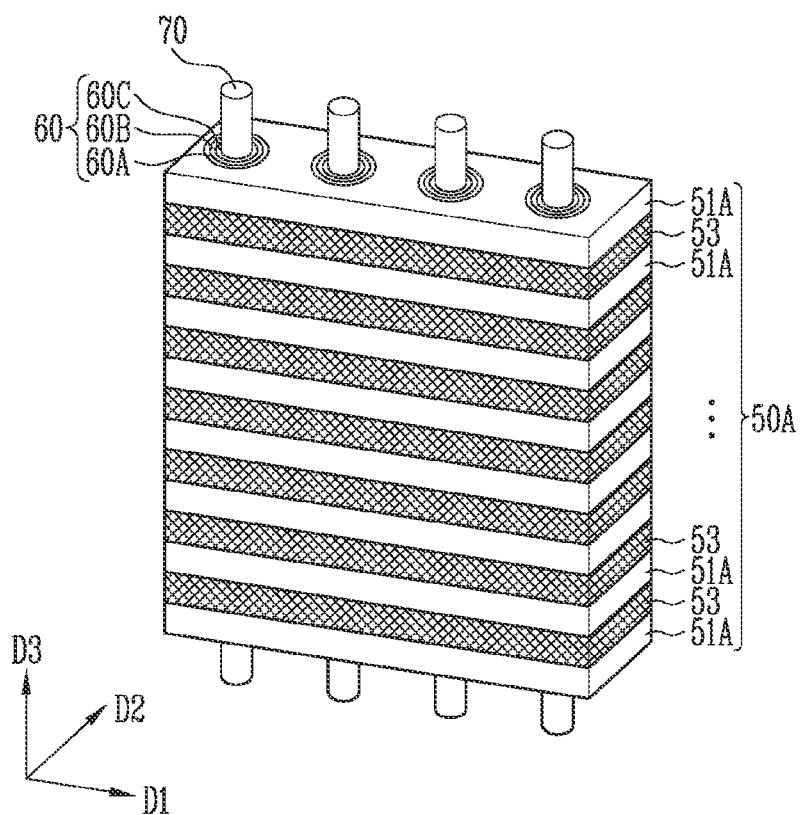
FIG. 3 is a perspective view illustrating a portion of a circuit region of a semiconductor memory device according to an embodiment of the present disclosure.

FIG. 3 is a perspective view illustrating a portion of a circuit region of a semiconductor memory device according to an embodiment of the present disclosure.

Referring to FIG. 3, a gate stacked structure 50A that surrounds a channel structure 70 may be arranged in the circuit region 10 as shown in FIG. 1.

The gate stacked structure 50A may include interlayer insulating layers 51A and conductive patterns 53 that are stacked alternately with each other in a vertical direction. The conductive patterns 53 may be insulated from each other by the interlayer insulating layers 51A. The conductive patterns 53 and the interlayer insulating layers 51A may extend on planes in different levels. Hereinafter, the first direction D1 and the second direction D2 as shown in FIG. 3 are defined as directions in which axes that cross each other on a plane are drawn, and a third direction D3 as shown in FIG. 3 is defined as a vertical direction.

At least one of the conductive patterns 53 may serve as the source select line SSL as shown in FIG. 2, at least another conductive pattern may serve as the drain select line DSL as shown in FIG. 2, and conductive patterns between the conductive pattern serving as the source select line SSL and the conductive pattern serving as the drain select line DSL may serve as the word lines WL as shown in FIG. 2.

The gate stacked structure 50A may be penetrated by the channel structure 70 that extends in the third direction D3. The channel structure 70 may include a channel layer which serves as a channel region.

A memory layer 60 may be disposed between the channel structure 70 and the gate stacked structure 50A. The memory layer 60 may include a blocking insulating layer 60A, a data storage layer 60B and a tunnel insulating layer 60C. The data storage layer 60B may include a material layer which stores data. According to an embodiment, the data storage layer 60B may include a material layer which stores data being changed by using Fowler-Nordheim (F-N) tunneling. The material layer of the data storage layer 60B may include a nitride layer that enables charge trapping. The blocking insulating layer 60A may be arranged between the data storage layer 60B and the gate stacked structure 50A. The tunnel insulating layer 60C may be arranged between the channel structure 70 and the data storage layer 60B.

Figure 4:
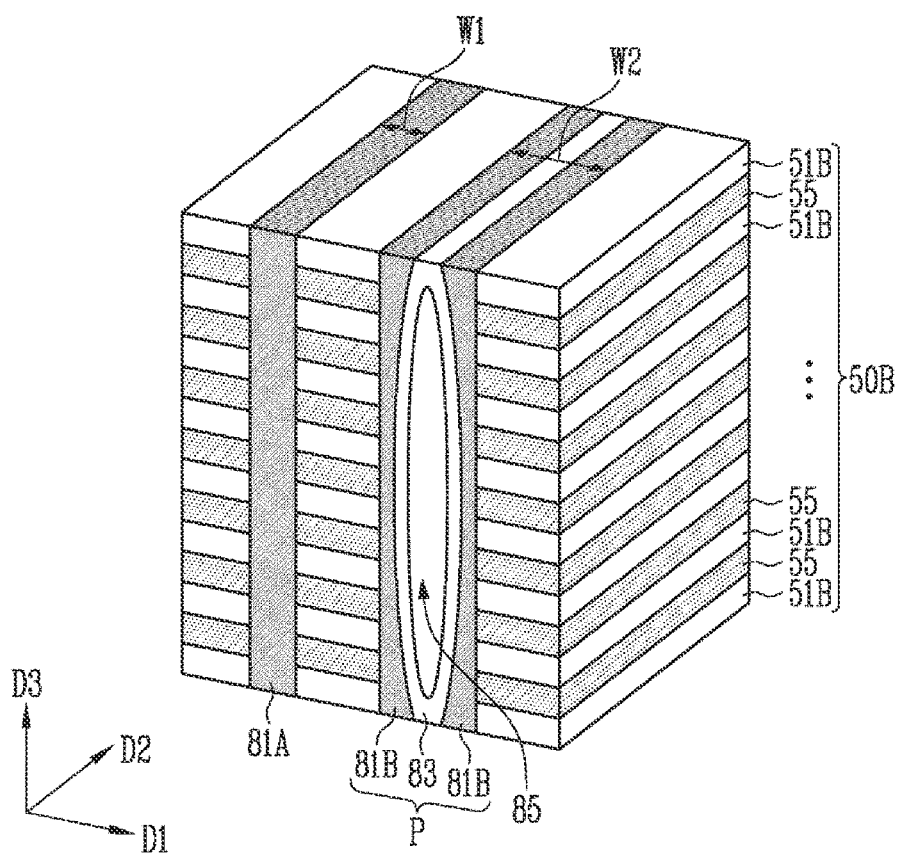
FIG. 4 is a perspective view illustrating an edge region of a semiconductor memory device according to an embodiment of the present disclosure.

FIG. 4 is a perspective view illustrating an edge region of a semiconductor memory device according to an embodiment of the present disclosure.

Referring to FIG. 4, a dummy stacked structure S0B may be arranged in the edge region 20 as shown in FIG. 1.

The dummy stacked structure 50B may include first material layers 51B and second material layers 55 that are stacked alternately with each other in the third direction D3. The first material layers 51B may be arranged at substantially the same levels as the interlayer insulating layers 51A as shown in FIG. 3. The first material layers 51B may include the same insulating material as the interlayer insulating layers 51A. The second material layers 55 may be arranged at substantially the same levels as the conductive patterns 53, respectively, as shown in FIG. 3. The second material layers 55 may include a different insulating material from the first material layers 51B. According to an embodiment, each of the first material layers 51B may include an oxide layer and each of the second material layers 55 may include a nitride layer.

The dummy pattern P may extend in the third direction D3 to pass through the dummy stacked structure SOB. The dummy pattern P may extend in a line shape along the edge region 20 as shown in FIG. 1. According to an embodiment, the dummy pattern P may extend in the first direction D1 and the second direction D2 along the edge region 20 as shown in FIG. 1.

The chip guard pattern 81A may extend in the third direction D3 to pass through the dummy stacked structure 50B. The chip guard pattern 81A may extend in a line shape along the edge region 20 as shown in FIG. 1. According to an embodiment, the chip guard pattern 81A may extend in the first direction D1 and the second direction D2 along the edge region as shown in FIG. 1.

A width W2 of the dummy pattern P may be greater than a width W1 of the chip guard pattern 81A. A gap, for example, an air-gap 85 may be defined in the dummy pattern P. The air-gap 85 may extend in the third direction D3. The dummy pattern P may include an insulating layer 83 and a metal layer 81B. The insulating layer 83 may extend to surround the air-gap 85. The metal layer 81B may be arranged between the insulating layer 83 and the dummy stacked structure 50B. The chip guard pattern 81A may include the same material as the metal layer 81B.

Figure 5:
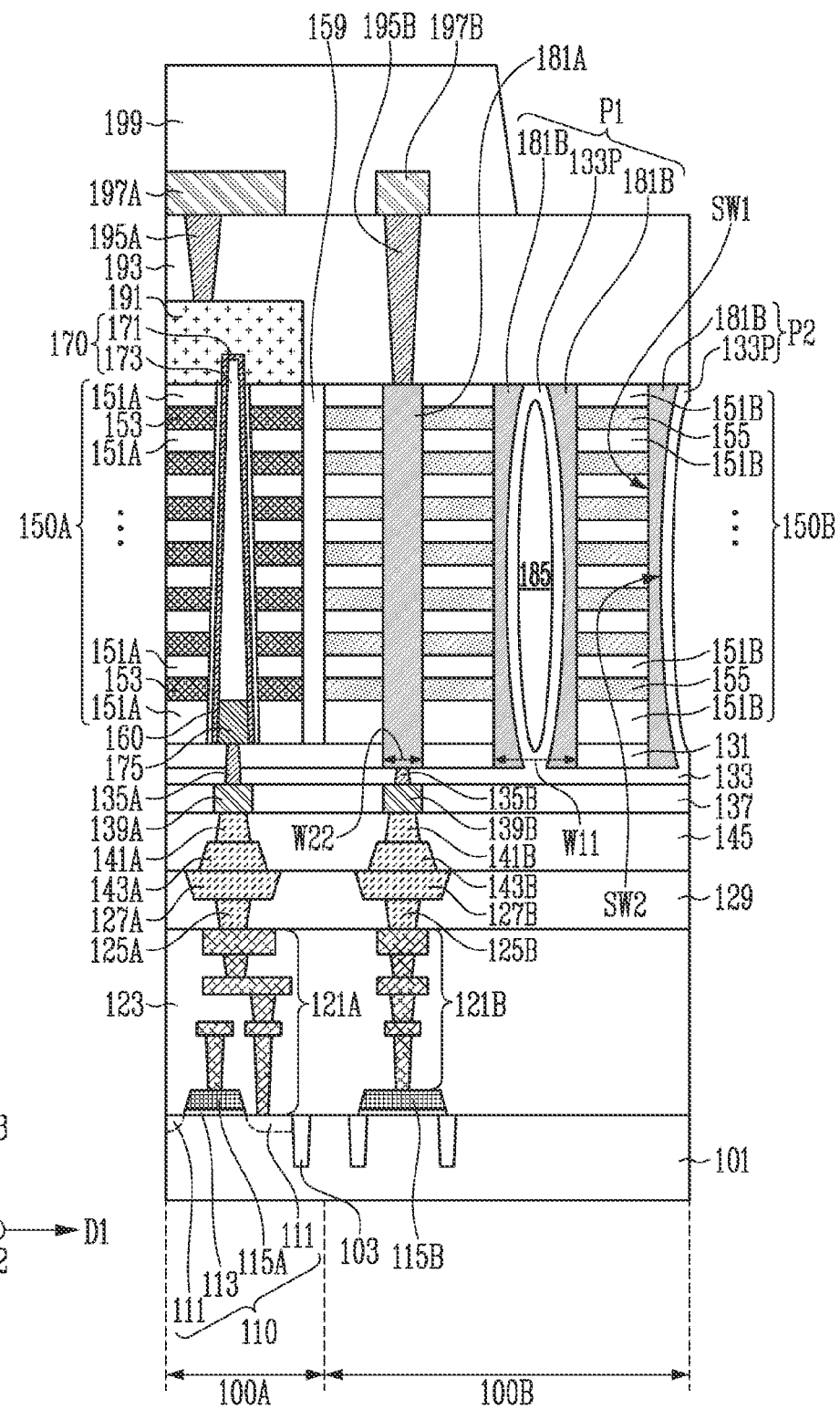
FIG. 5 is a cross-sectional diagram illustrating a semiconductor memory device according to an embodiment of the present disclosure.

FIG. 5 is a cross-sectional diagram illustrating a semiconductor memory device according to an embodiment of the present disclosure. FIG. 5 is a cross-sectional diagram illustrating a portion of a semiconductor memory device taken along the first direction D1.

Referring to FIG. 5, a semiconductor memory device may include a substrate 101 that includes a memory cell array region 100A and an edge region 100B, and a transistor 110 that constitutes a peripheral circuit. In an embodiment, the edge region 100B may correspond to the edge region 20 of FIG. 1 and the memory cell array region 100A may correspond to the circuit region 10 of FIG. 1.

The substrate 101 may be a semiconductor substrate such as a silicon substrate or a germanium substrate. The substrate 101 may extend in the first direction D1 and the second direction D2. The substrate 101 may include a plurality of areas that are divided by isolation layers 103. In the memory cell array region 100A, the substrate 101 may include an active region that is divided by the isolation layers 103.

The transistor 110 may include a gate insulating layer 113, a gate electrode 115A, and junctions 111. The gate insulating layer 113 and the gate electrode 115A may be stacked on the substrate 101. The junctions 111 may be defined in the active region by injecting at least one of n type impurities and p type impurities into the substrate 101 at both sides of the gate electrode 115A.

The semiconductor memory device may include a first insulating structure 123 that covers the substrate 101 and the transistor 110, an interconnection 121A that is embedded in the first insulating structure 123, and first and second chip guard patterns 115B and 121B that are embedded in the first insulating structure 123.

The first insulating structure 123 may include insulating layers formed in a double layer or multiple layers. The interconnection 121A may be connected to the transistor 110 and include conductive patterns having various structures.

The first chip guard pattern 115B may be arranged at substantially the same level as the gate electrode 115A and may have the same conductive material as the gate electrode 115A. The second chip guard pattern 121B may overlap the first chip guard pattern 115B. The second chip guard pattern 121B may be arranged at substantially the same level as the interconnection 121A and may have the same conductive material as the interconnection 121A. The first chip guard pattern 115B and the second chip guard pattern 121B may extend in a line shape. According to an embodiment, the first chip guard pattern 115B and the second chip guard pattern 121B may extend in the second direction D2.

The semiconductor memory device may include a second insulating structure 129 on the first insulating structure 123, conductive patterns 125A and 127A that are embedded in the second insulating structure 129, and third and fourth chip guard patterns 125B and 127B that are embedded in the second insulating structure 129. The third and fourth chip guard patterns 125B and 127B may extend in a line shape. According to an embodiment, the third and fourth chip guard patterns 125B and 127B may extend in the second direction D2.

The second insulating structure 129 may include at least one insulating layer. The conductive patterns 125A and 127A may include a first conductive pattern 125A and a second conductive pattern 127A that are arranged in different levels. The first conductive pattern 125A may contact the interconnection 121A, and the second conductive pattern 127A may be connected to the interconnection 121A through the first conductive pattern 125A. The second conductive pattern 127A may serve as a bonding pattern.

The third chip guard pattern 125B may overlap the second chip guard pattern 121B. The third chip guard pattern 125B may be arranged in substantially the same level as the first conductive pattern 125A and may have the same conductive material as the first conductive pattern 125A. The fourth chip guard pattern 127B may overlap the third chip guard pattern 125B. The fourth chip guard pattern 127B may be arranged in substantially the same level as the second conductive pattern 127A and may have the same conductive material as the second conductive pattern 127A.

The semiconductor memory device may include a three-dimensional memory cell array. The three-dimensional memory cell array may include a gate stacked structure 150A, a channel structure 170 passing through the gate stacked structure 150A in the third direction D3, and a memory layer 160 passing through the gate stacked structure 150A in the third direction D3.

The gate stacked structure 150A may be arranged on the substrate 101 in the memory cell array region 100A. The gate stacked structure 150A may include interlayer insulating layers 151A and conductive patterns 153 that are stacked alternately with each other in the third direction D3. The conductive patterns 153 may be insulated from each other by the interlayer insulating layers 151A. At least one of the conductive patterns 153 may serve as the source select line SSL as shown in FIG. 2, at least another conductive pattern may serve as the drain select line DSL as shown in FIG. 2, and conductive patterns between the conductive pattern serving as the source select line SSL and the conductive pattern serving as the drain select line may serve as the word lines WL as shown in FIG. 2. According to an embodiment, one layer of the conductive pattern which is the most adjacent to the substrate 101, among the conductive patterns 153, may serve as the drain select line DSL as shown in FIG.

2. One layer of the conductive pattern which is farthest away from the substrate 101 may serve as the source select line SSL as shown in FIG. 2. The remaining conductive patterns may serve as the word lines WL as shown in FIG. 2.

The memory layer 160 may be arranged between the gate stacked structure 150A and the channel structure 170. The memory layer 160 may include the blocking insulating layer 60A, the data storage layer 60B, and the tunnel insulating layer 60C as shown in FIG. 3.

The channel structure 170 may include a channel layer 171 and a core insulating layer 173. The core insulating layer 173 may be arranged in a central area of the channel structure 170. A doped semiconductor pattern 175 as well as the core insulating layer 173 may be arranged at the central area of the channel structure 170. The doped semiconductor pattern 175 may be arranged in the central area of the channel structure 170 at an end portion of the channel structure 170. According to an embodiment, the doped semiconductor pattern 175 may be arranged in a portion of the central area of the channel structure 170 at the end portion of the channel structure 170 toward the substrate 101. The channel layer 171 may include a semiconductor layer that constitutes the channel region. According to an embodiment, the channel layer 171 may include a silicon layer. The channel layer 171 may extend along a sidewall of the doped semiconductor pattern 175 and a sidewall of the core insulating layer 173 in the third direction D3. The channel layer 171 may extend along the surface of the core insulating layer 171 in the third direction D3. The memory layer 160 may be interposed between the gate stacked structure 150A and the channel layer 171.

The semiconductor memory device may include a bit line 139A and a source layer 191 that are connected to the channel layer 171. The channel layer 171 may be arranged between the bit line 139A and the source layer 191. According to an embodiment, the bit line 139A may be arranged between the gate stacked structure 150A and the substrate 101, and the source layer 191 may be arranged in a level more distant from the substrate 101 than the gate stacked structure 150A.

The bit line 139A may be connected to the channel layer 171 through a bit line contact 135A and the doped semiconductor pattern 175. The bit line contact 135A may pass through at least one insulating layer to contact the doped semiconductor pattern 175. According to an embodiment, the bit line contact 135A may pass through a first insulating layer 131 and a second insulating layer 133 between the gate stacked structure 150A and the bit line 139A. The first insulating layer 131 may be arranged between the gate stacked structure 150A and the second insulating layer 133. The bit line 139A may be embedded in a third insulating layer 137 between the second insulating layer 133 and the second insulating structure 129.

The source layer 191 may contact the channel layer 171. The source layer 191 may extend along the surface of the gate stacked structure 150A toward the third direction D3 and may contact the end portion of the channel layer 171 toward the third direction D3. The source layer 191 may include a doped semiconductor layer.

The semiconductor memory device may include a third insulating structure 145 between the third insulating layer 137 and the second insulating structure 129 and conductive patterns 141A and 143A embedded in the third insulating structure 145.

The third insulating structure 145 may include at least one insulating layer. The conductive patterns 141A and 143A may include a third conductive pattern 141A and a fourth conductive patterns 143A that are arranged in different levels. The third conductive pattern 141A may contact a bit line 139A, and the fourth conductive pattern 143A may be connected to the bit line 139A through the third conductive pattern 141A. The fourth conductive pattern 143A may serve as a bonding pattern that is bonded to the second conductive pattern 127A.

The semiconductor memory device may include a dummy stacked structure 150B that opposes the gate stacked structure 150A, a fifth chip guard pattern 181A that passes through the dummy stacked structure 150B, and dummy patterns P1 and P2 that pass through the dummy stacked structure 150B. The dummy patterns P1 and P2 may include a first dummy pattern P1 and a second dummy pattern P2.

A vertical insulating layer 159 may be arranged between the dummy stacked structure 150B and the gate stacked structure 150A. The dummy stacked structure 150B may include first material layers 151B and second material layers 155 that are stacked alternately with each other in the third direction D3. The first material layers 151B and the second material layers 155 of the dummy stacked structure 150B may include the insulating materials as described above with reference to FIG. 4. The vertical insulating layer 159 may extend in the second direction D2.

The fifth chip guard pattern 181A, the first dummy pattern P1 and the second dummy pattern P2 may pass through the dummy stacked structure 150B in the third direction D3. The first insulating layer 131 may extend along the surface of the dummy stacked structure 150B toward the substrate 101. The fifth chip guard pattern 181A, the first dummy pattern P1, and the second dummy pattern P2 may extend to pass through the first insulating layer 131. The fifth chip guard pattern 181A may be arranged closer to the gate stacked structure 150A than the first dummy pattern P1. The second dummy pattern P2 may be arranged more distant from the gate stacked structure 150A than the first dummy pattern P1. A width W11 of the first dummy pattern P1 may be greater than a width W22 of the fifth chip guard pattern 181A. The fifth chip guard pattern 181A, the first dummy pattern P1 and the second dummy pattern P2 may be formed in a line shape that extends in a direction crossing the channel layer 171. According to an embodiment, the fifth chip guard pattern 181A, the first dummy pattern P1 and the second dummy pattern P2 may extend substantially in parallel with each other, and may extend in the second direction D2.

The fifth chip guard pattern 181A may include a metal layer. Each of the first dummy pattern P1 and the second dummy pattern P2 may include an insulating layer 133P and a metal layer 181B. The metal layer 181B and the fifth chip guard pattern 181A may have the same material. The insulating layer 133P may be a part of the second insulating layer 133 that extends to the surface of the metal layer 181B.

A gap, for example, an air-gap 185 may be defined in the first dummy pattern P1. The air-gap 185 may extend in the third direction D3. The insulating layer 133P of the first dummy pattern P1 may extend to surround the air-gap 185. The metal layer 181B of the first dummy pattern P1 may be arranged between the insulating layer 133P and the dummy stacked structure 150B. The air-gap 185 may extend in the second direction D2 in the first dummy pattern P1 having the line shape.

The second dummy pattern P2 may extend along a sidewall SW1 of the dummy stacked structure 150B. The metal layer 181B of the second dummy pattern P2 may be formed on the sidewall SW1 of the dummy stacked structure 150B. The insulating layer 133P of the second dummy pattern P2 may be formed on a sidewall SW2 of the metal layer 181B.

Each of the second insulating layer 133, the third insulating layer 137 and the third insulating structure 145 may extend to overlap the substrate 101 in the edge region 100B. A sixth chip guard pattern 135B may pass through the second insulating layer 133. A seventh chip guard pattern 139B may pass through the third insulating layer 137. An eighth chip guard pattern 141B and a ninth chip guard pattern 143B may be embedded in the third insulating structure 145. The sixth chip guard pattern 135B, the seventh chip guard pattern 139B, the eighth chip guard patterns 141B, and the ninth chip guard pattern 143B may be formed in a line shape that extends in a direction crossing the channel layer 171. According to an embodiment, the sixth chip guard pattern 135B, the seventh chip guard pattern 139B, the eighth chip guard patterns 141B, and the ninth chip guard pattern 143B may extend in the second direction D2.

The sixth chip guard pattern 135B may have the same conductive material as the bit line contact 135A. The seventh chip guard pattern 139B may have the same conductive material as the bit line 139A. The eighth chip guard pattern 141B may have the same material as the third conductive pattern 141A. The ninth chip guard pattern 143B may have the same conductive material as the fourth conductive pattern 143A. The sixth chip guard pattern 135B, the seventh chip guard pattern 139B, the eighth chip guard pattern 141B, and the ninth chip guard pattern 143B may be arranged in a row between the fifth chip guard pattern 181A and the fourth chip guard pattern 127B.

The semiconductor memory device may include an upper insulating layer 193, a source contact 195A that passes through the upper insulating layer 193, a 10th chip guard pattern 195B that passes through the upper insulating layer 193, an upper wire 197A that contacts the source contact 195A, an 11th chip guard pattern 197B that contacts the 10th chip guard pattern 195B, and a protective layer 199. The 10th chip guard pattern 195B and the 11th chip guard pattern 197B may be formed in a line shape that extends in a direction crossing the channel layer 171. According to an embodiment, the 10th chip guard pattern 195B and the 11th chip guard pattern 197B may extend in the second direction D2.

The upper insulating layer 193 may cover the source layer 191 and the dummy stacked structure 150B. The first and second dummy patterns P1 and P2 may be covered by the upper insulating layer 193.

The upper wire 197A and the 11th chip guard pattern 197B may be arranged on the upper insulating layer 193 and covered by the protective layer 199 on the upper insulating layer 193. The upper wire 197A and the 11th chip guard pattern 197B may include the same metal. The upper wire 197A may be connected to the source layer 191 through the source contact 195A. The 11th chip guard pattern 197B may be connected to the fifth chip guard pattern 181A through the 10th chip guard pattern 195B. The source contact 195A and the 10th chip guard pattern 195B may include the same conductive material.

During the processes of manufacturing the semiconductor memory device according to the above-described embodiments, a dummy pattern that has the same structure as the dummy pattern P as shown in FIG. 4 or the first dummy pattern P1 as shown in FIG. 5 may be formed in a scribe region. The dummy pattern formed in the scribe region and a method of separating chip patterns using the same will be described below.

Figure 6:
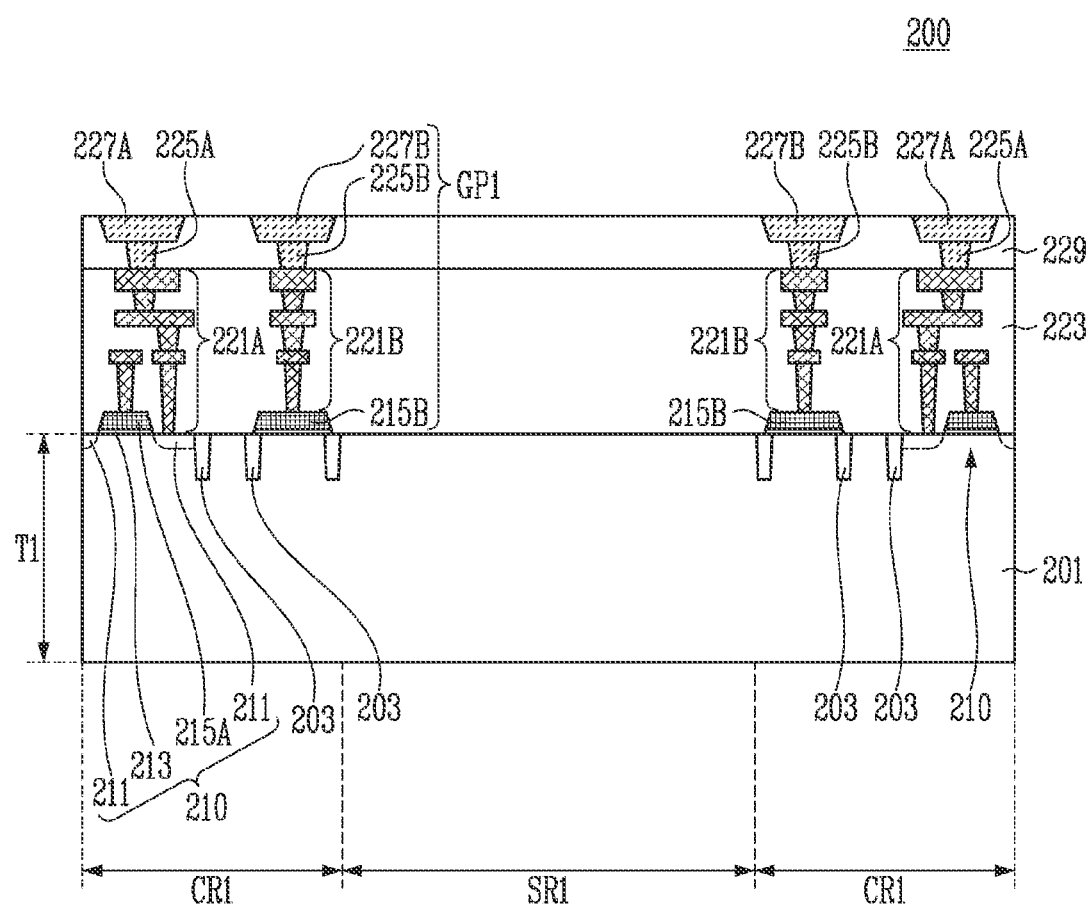
FIG. 6 is a cross-sectional diagram illustrating a first circuit structure of a semiconductor memory device according to an embodiment of the present disclosure.

FIG. 6 is a cross-sectional diagram illustrating a first circuit structure 200 of a semiconductor memory device according to an embodiment of the present disclosure. Hereinafter, any repetitive detailed description of components having already been mentioned above with reference to FIG. 5 will be omitted. In an embodiment, the first chip region CR1 may include the circuit region 10 of FIG. 1 and a portion of the edge region 20 of FIG. 1 and the first scribe region SR1 may include the other portion of the edge region 20 of FIG. 1.

Referring to FIG. 6, the first circuit structure 200 may include a semiconductor substrate 201 that includes a first chip region CR1 and a first scribe region SR1, a transistor 210 that constitutes a peripheral circuit, an interconnection 221A that is connected to the transistor 210, conductive patterns 225A and 227A that are connected to the interconnection 221A, and a first group of chip guard patterns GP1.

The semiconductor substrate 201 may have a first thickness T1. The semiconductor substrate 201 may include a plurality of areas that are divided by isolation layers 203. In the first chip region CR1, the semiconductor substrate 201 may include an active region that is divided by the isolation layers 203.

The transistor 210 may be arranged in the active region. The transistor 210 may include a gate insulating layer 213, a gate electrode 215A, and junctions 211.

The conductive patterns 225A and 227A may include a first conductive pattern 225A on the interconnection 221A and a second conductive pattern 227A on the first conductive pattern 225A. The second conductive pattern 227A may serve as a bonding pattern that is connected to the interconnection 221A through the first conductive pattern 225A.

The chip guard patterns GP1 of the first group may include a first chip guard pattern 215B arranged at substantially the same level as the gate electrode 215A, a second chip guard pattern 221B arranged at substantially the same level as the interconnection 221A, a third chip guard pattern 225B arranged at substantially the same level as the first conductive pattern 225A, and a fourth chip guard pattern 227B arranged at substantially the same level as the second conductive pattern 227A.

The transistor 210, the interconnection 221A, the first chip guard pattern 215B and the second chip guard pattern 221B may be embedded in a first insulating structure 223 on the semiconductor substrate 201. The first conductive pattern 225A, the second conductive pattern 227A, the third chip guard pattern 225B, and the fourth chip guard pattern 227B may be embedded in a second insulating structure 229 on the first insulating structure 223.

Figure 7:
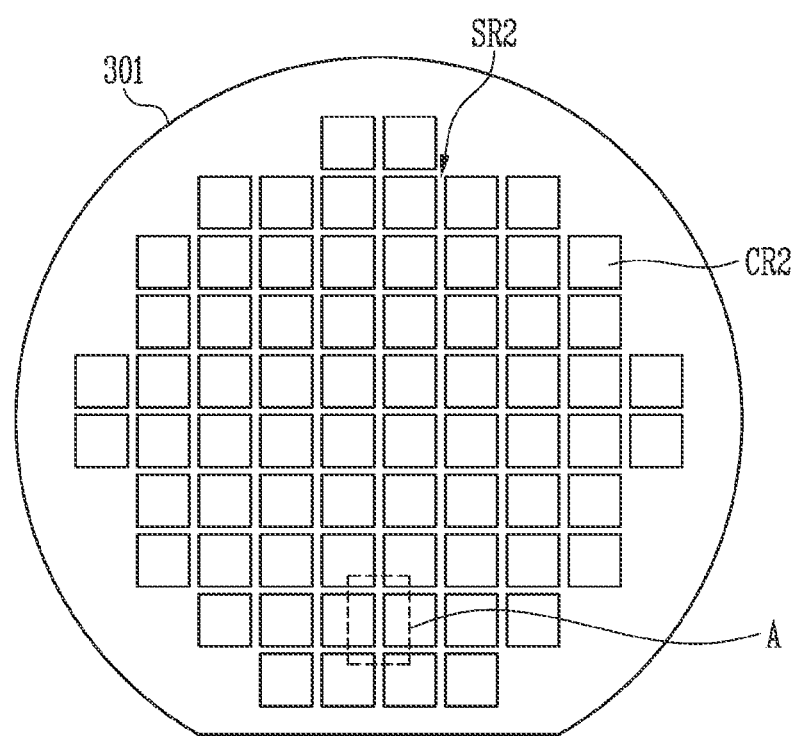
FIG. 7 is a diagram illustrating a support substrate according to an embodiment of the present disclosure.

FIG. 7 is a diagram illustrating a support substrate 301 according to an embodiment of the present disclosure.

Referring to FIG. 7, the support substrate 301 may be a semiconductor wafer. According to an embodiment, the support substrate 301 may include a silicon wafer. The support substrate 301 may include a second chip region CR2 and a second scribe region SR2. The second chip region CR2 may be surrounded by the second scribe region SR2. In other words, the second chip region CR2 may be divided by the second scribe region SR2. The second chip region CR2 may be designed in consideration of the first chip region CR1 as shown in FIG. 6. The second scribe region SR2 may be designed in consideration of the first scribe region SR1 as shown in FIG. 6.

Figure 8:
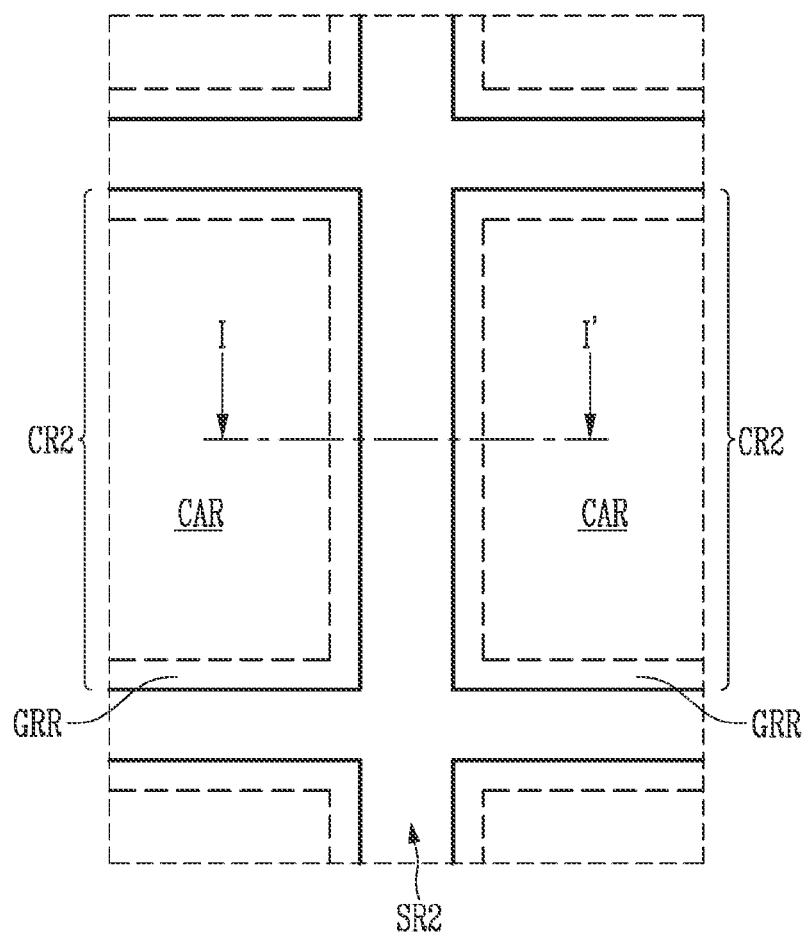
FIG. 8 is an enlarged view of an area A shown in FIG. 7.

FIG. 8 is an enlarged view of an area A shown in FIG. 7.

Referring to FIG. 8, the second chip region CR2 may include a memory cell array region CAR and a guarding region GRR. In an embodiment, the first chip region CR1 may relate to the second chip region CR2 of FIG. 6 and the second scribe region SR2 may relate to the first scribe region SR1 of FIG. 6.

Figure 9:
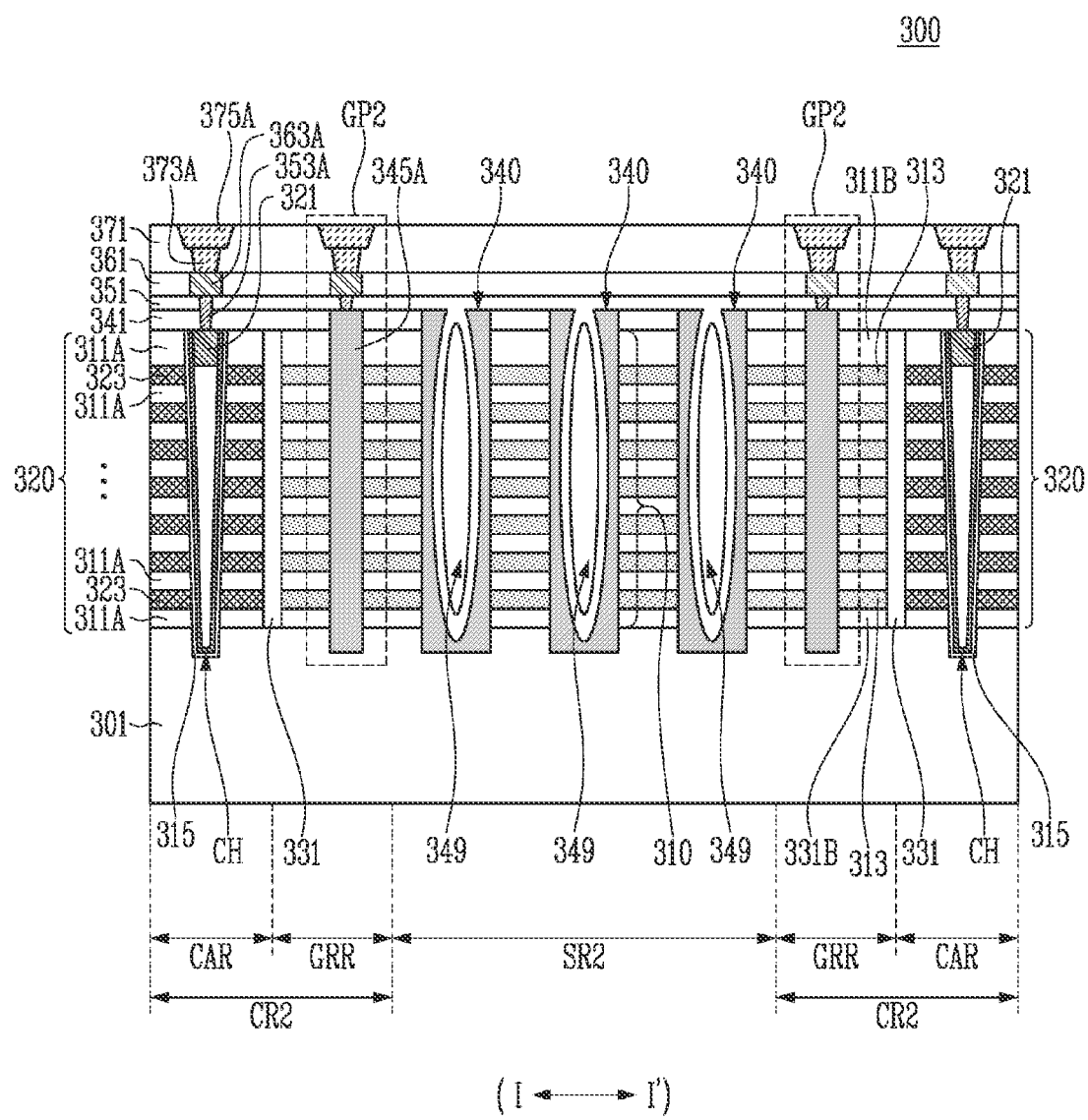
FIG. 9 is a cross-sectional diagram illustrating a second circuit structure of a semiconductor memory device taken along line I-I' as shown in FIG. 8.

FIG. 9 is a cross-sectional diagram illustrating a second circuit structure 300 of a semiconductor memory device taken along line I-I' as shown in FIG. 8.

Referring to FIG. 9, the second circuit structure 300 may include a gate stacked structure 320 on the support substrate 301, a channel structure CH and a memory layer 315 that pass through the gate stacked structure 320, a bit line 363A that is connected to the channel structure CH, conductive patterns 373A and 375A that are connected to the bit line 363A, a dummy stacked structure 310 on the support substrate 301, a second group of chip guard patterns GP2, and dummy patterns 340 that pass through the dummy stacked structure 310.

The gate stacked structure 320 may include interlayer insulating layers 311A and conductive patterns 323 that are stacked alternately on the support substrate 301 in the memory cell array region CAR. The memory layer 315 may be arranged between the channel structure CH and the gate stacked structure 320.

The dummy stacked structure 310 may include first material layers 311B and second material layers 313 that are stacked alternately on the support substrate 301 in the second scribe region SR2. The dummy stacked structure 310 may extend to the guarding region GRR in the second chip region CR2 toward the gate stacked structure 320. A vertical insulating layer 331 may be arranged between the dummy stacked structure 310 and the gate stacked structure 320.

The gate stacked structure 320 and the dummy stacked structure 310 may be covered by at least one insulating layer. According to an embodiment, the gate stacked structure 320 and the dummy stacked structure 310 may include a first insulating layer 341, a second insulating layer 351, and a third insulating layer 361.

The bit line 363A may pass through the third insulating layer 361. The bit line 363A may be connected to the channel structure CH through a bit line contact 353A that passes through the first insulating layer 341 and the second insulating layer 351. The bit line contact 353A may contact a doped semiconductor pattern 321 that fills an upper end of the central area of the channel structure CH.

The conductive patterns 373A and 375A may be embedded in a third insulating structure 371 on the third insulating layer 361. The conductive patterns 373A and 375A may include a third conductive pattern 373A that contacts the bit line 363A and a fourth conductive pattern 375A on the third conductive pattern 373A. The fourth conductive pattern 375A may serve as a bonding pattern that is connected to the bit line 363A through the third conductive pattern 373A.

The second group of the chip guard patterns GP2 may include a plurality of conductive chip guard patterns that are stacked on the guarding region GRR in the second chip region CR2. The second group of the chip guard patterns GP2 may pass through the dummy stacked structure 310, the first insulating layer 341, the second insulating layer 351, the third insulating layer 361, and the third insulating structure 371.

The dummy patterns 340 may be arranged on the second scribe region SR2. The dummy patterns 340 may pass through the dummy stacked structure 310 and the first insulating layer 341. FIG. 9 shows an embodiment in which the three dummy patterns 340 are arranged on the second scribe region SR2. However, the number of dummy patterns 340 may not be limited thereto and may vary.

Gaps, for example, air-gaps 349, may be defined in the dummy patterns 340, respectively. Each of the air-gaps 349 may extend in a direction in which the first material layers 311B and the second material layers 313 are stacked on top of each other. The air-gaps 349 may be defined when a fifth chip guard pattern 345A and the second insulating layer 351 are formed. The fifth chip guard pattern 345A may be a part of the chip guard patterns GP2 of the second group and may pass through the dummy stacked structure 310 and the first insulating layer 341.

FIGS. 10A to 10F are cross-sectional diagrams illustrating a method of manufacturing the second circuit structure 300 according to an embodiment of the present disclosure.

Figure 10A:
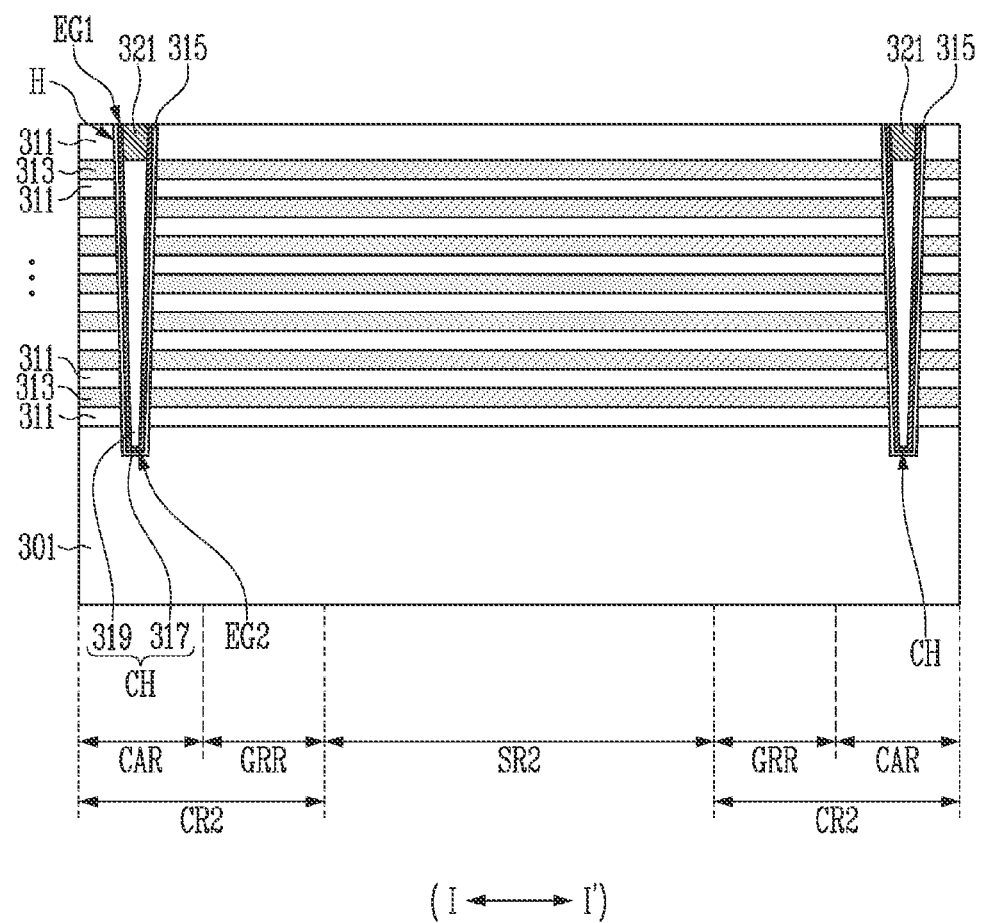

Referring to FIG. 10A, first material layers 311 and the second material layers 313 may be stacked alternately on the support substrate 301. The second material layer 313 may include a material having an etch selectivity with respect to the first material layers 311. According to an embodiment, each of the first material layers 311 may include a silicon oxide layer, and each of the second material layers 313 may include a silicon nitride layer.

Subsequently, channel holes H may be formed through the first material layers 311 and the second material layers 313. The channel holes H may expose the support substrate 301 in the memory cell array region CAR of the second chip region CR2. The channel holes H may extend into the support substrate 301.

Hereinafter, the memory layer 315 may be formed on the surface of the channel hole H. The memory layer 315 may include the blocking insulating layer 60A, the data storage layer 60B, and the tunnel insulating layer 60C as shown in FIG. 3.

Subsequently, the channel structure CH may be formed on the memory layer 315. The channel structure CH may include a channel layer 317 and a core insulating layer 319. The channel layer 317 may be formed on the memory layer 315. The channel layer 317 may include a semiconductor layer. The channel layer 317 may include a first end portion EG1 and a second end portion EG2 in opposite directions. The second end portion EG2 may extend toward the support substrate 301. The memory layer 315 may extend between the support substrate 301 and the second end portion EG2 of the channel layer 317. The central area of the channel hole H which is opened by the channel layer 317 may be filled with the core insulating layer 319 and the doped semiconductor pattern 321.

Figure 10B:
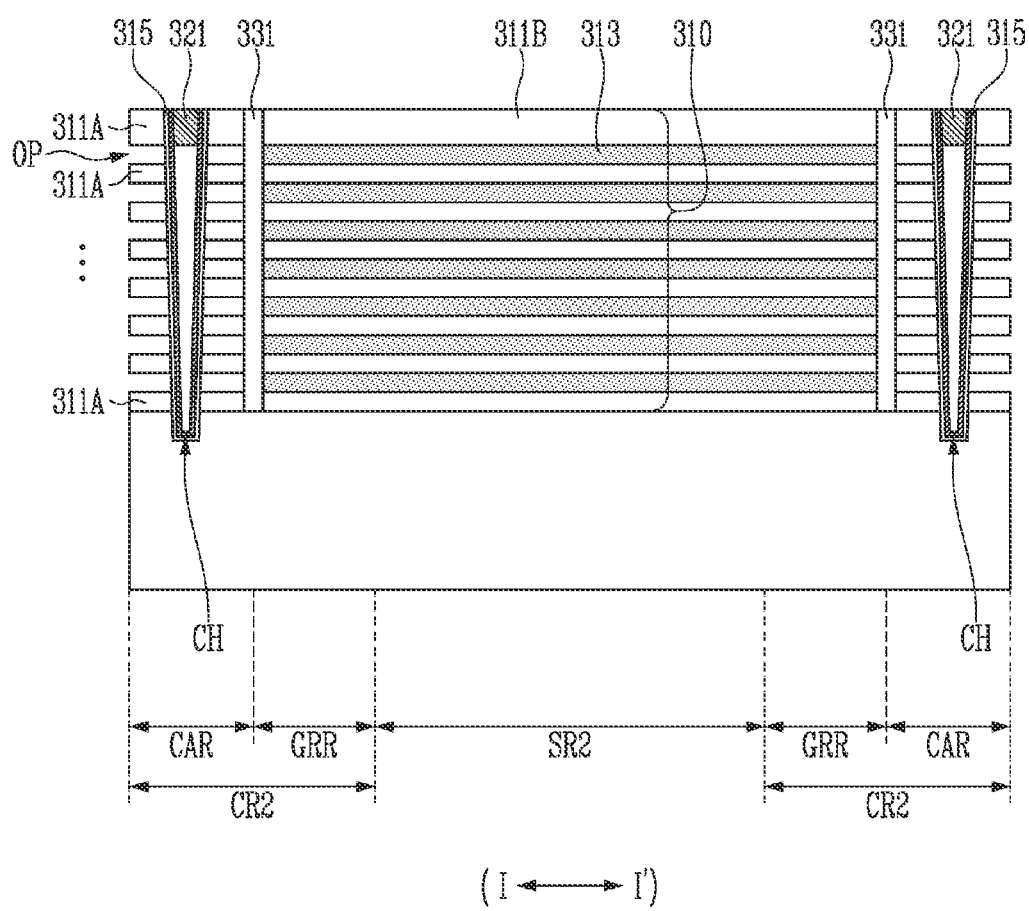

Referring to FIG. 10B, the vertical insulating layer 331 may be formed at the boundary between the memory cell array region CAR and the guarding region GRR in the second chip region CR2. The vertical insulating layer 331 may pass through the first material layers 311 and the second material layers 313 as shown in FIG. 10A. The dummy stacked structure 310 may be defined by the vertical insulating layer 331. The first material layers 311 as shown in FIG. 10A may be divided into the interlayer insulating layers 311A and the first material layers 311B by the vertical insulating layer 331. The interlayer insulating layers 311A may overlap the memory cell array region CAR. The first material layers 311B may remain as the dummy stacked structure 310.

Subsequently, a portion of each of the second material layers 313 overlapping the memory cell array region CAR in the second chip region CR2 may be selectively removed. As a result, openings OP may be defined between the interlayer insulating layers 311A. The second material layers 313 between the first material layers 311B may be protected by the vertical insulating layer 331 and may remain as the dummy stacked structure 310.

Figure 10C:
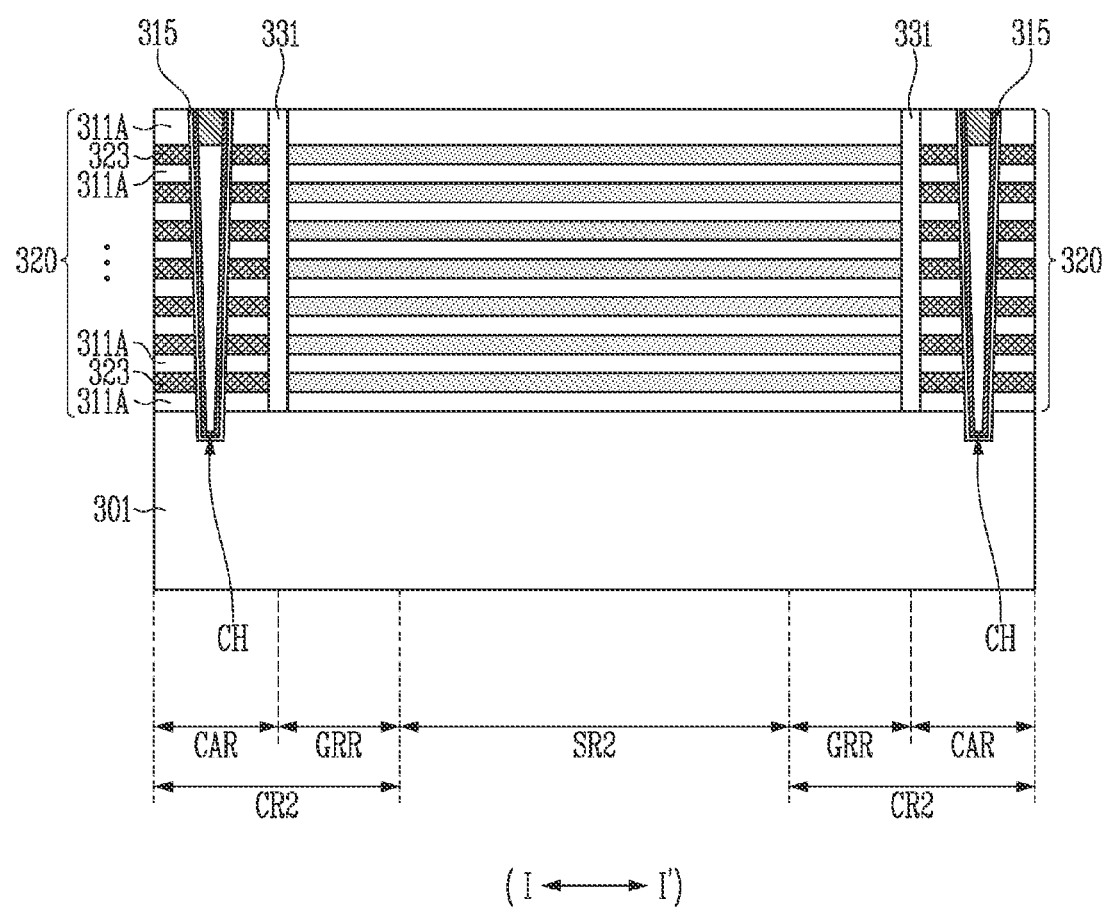

Referring to FIG. 10C, the openings OP as shown in FIG. 10B may be filled with the conductive patterns 323, respectively. Each of the conductive patterns 323 may extend to surround a sidewall of the memory layer 315.

As described above with reference to FIGS. 10B and 10C, by replacing the portion of the second material layers 313 with the conductive patterns 323, the gate stacked structure 320 may be defined on the support substrate 301 in the memory cell array region CAR of the second chip region CR2.

Figure 10D:
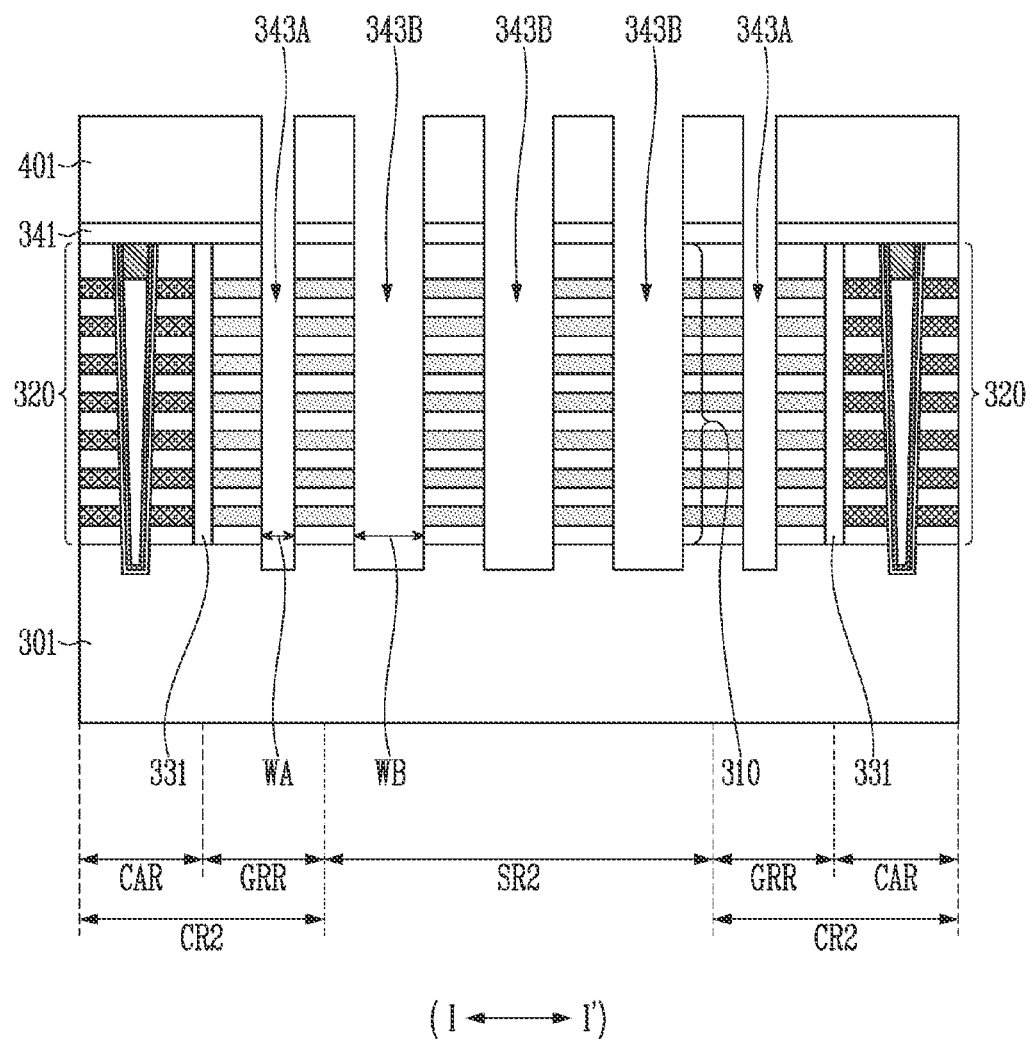

Referring to FIG. 10D, the first insulating layer 341 may be formed. The first insulating layer 341 may extend to cover the gate stacked structure 320 and the dummy stacked structure 310. A mask pattern 401 may be formed on the first insulating layer 341. The dummy stacked structure 310 may be etched by an etch process using the mask pattern 401 as an etch barrier. Therefore, a guard groove 343A and dummy grooves 343B may be defined.

The guard groove 343A may expose the support substrate 301 in the guarding region GRR of the second chip region CR2. The dummy grooves 343B may expose the support substrate 301 in the second scribe region SR2. A width WA of the guard groove 343A may be narrower than a width WB of each of the dummy grooves 343B. The guard groove 343A and the dummy grooves 343B may extend into the support substrate 301.

The mask pattern 401 may be removed after the guard groove 343A and the dummy grooves 343B are formed.

Referring to FIG. 10E, the fifth chip guard pattern 345A may be formed in the guard groove 343A. Forming the fifth chip guard pattern 345A may include filling the guard groove 343A with a metal layer.

The metal layer that fills the guard groove 343A may be deposited onto the surface of each of the dummy grooves 343B. The deposition thickness of the metal layer may fill the guard groove 343A and open the central area of each of the dummy grooves 343B. The width WB of each of the dummy grooves 343B may be defined to be greater than the width WA of the guard groove 343A. Therefore, even when the guard groove 343A is completely filled with the metal layer, the central area of the dummy grooves 343B may be opened without being filled with the metal layer.

Thereafter, the metal layer may be planarized to expose the first insulating layer 341. Therefore, the metal layer may be separated into the fifth chip guard pattern 345A that fills the guard groove 343A and a dummy metal layer 345B on the surface of each of the dummy grooves 343B. The dummy metal layer 345B may have a U-shaped cross section.

Subsequently, the second insulating layer 351 may be formed on the first insulating layer 341. The second insulating layer 351 may extend into the dummy grooves 343B to form a dummy insulating layer 351P. The dummy insulating layer 351P may extend along the surface of the dummy metal layer 345B and may block upper ends of the dummy grooves 343B. Accordingly, the air-gap 349 may be defined in the central area of each of the dummy grooves 343B. The dummy metal layer 345B and the dummy insulating layer 351P may form the dummy pattern 340.

According to the above-described processes, the air-gap 349 may be surrounded by the dummy insulating layer 351P which is a part of the second insulating layer 351. In addition, the dummy metal layer 345B may remain on a sidewall of the dummy insulating layer 351P and may extend between the dummy insulating layer 351P and the support substrate 301. In addition, the width of the dummy pattern 340 which is defined by the width WB of the dummy groove 343B may be greater than the width of the fifth chip groove 345A which is defined by the width WA of the guard groove 343A.

Figure 10F:
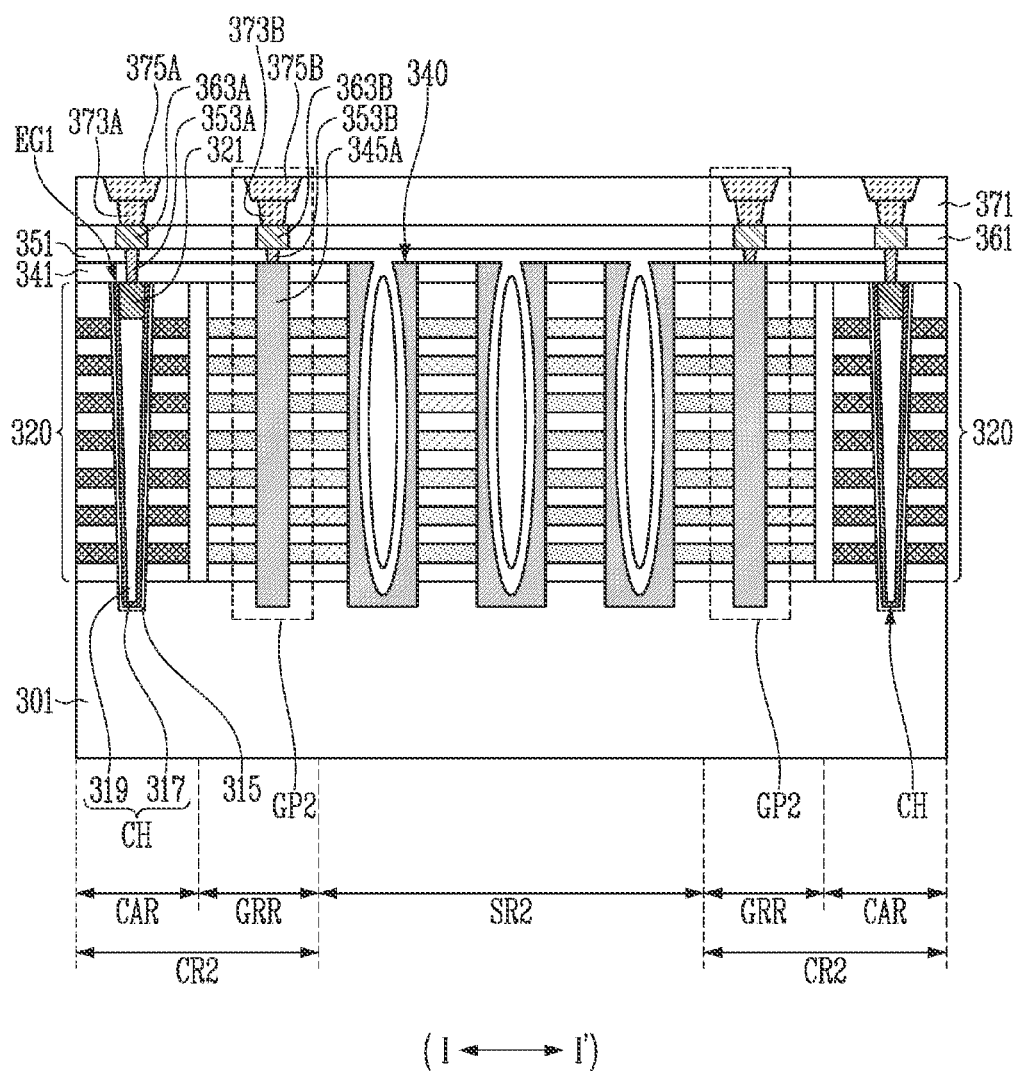

Referring to FIG. 10F, when the bit line contact 353A that passes through the second insulating layer 351 and the first insulating layer 341 is formed, a sixth chip guard pattern 353B that passes through the second insulating layer 351 may be formed. The bit line contact 353A may be connected to the channel layer 317 through the doped semiconductor pattern 321. The sixth chip guard pattern 353B may contact the fifth chip guard pattern 345A.

Subsequently, the third insulating layer 361 may be formed on the second insulating layer 351. Subsequently, the bit line 363A may be formed on the first end portion EG1 of the channel layer 317. The bit line 363A may pass through the third insulating layer 361 and be connected to the channel layer 317 through the bit line contact 353A and the doped semiconductor pattern 321.

A seventh chip guard pattern 363B that passes through the third insulating layer 361 may be formed while the bit line 363A is formed.

Subsequently, a third conductive pattern 373A and a fourth conductive pattern 375A that are embedded in the third insulating structure 371 may be formed. An eighth chip guard pattern 373B and a ninth chip guard pattern 375B may be formed while the third conductive pattern 373A and the fourth conductive pattern 375A are formed. The ninth chip guard pattern 375B may be connected to the seventh chip guard pattern 363B through the eighth chip guard pattern 373B. The fifth chip guard pattern 345A, the sixth chip guard pattern 353B, the seventh chip guard pattern 363B, the eighth chip guard patterns 373B, and the ninth chip guard pattern 375B may constitute the second group of the chip guard patterns GP2.

FIGS. 11A to 11H are cross-sectional diagrams illustrating an embodiment of subsequent processes performed after the first circuit structure 200 shown in FIG. 6 and the second circuit structure 300 shown in FIG. 9 are provided.

Figure 11A:
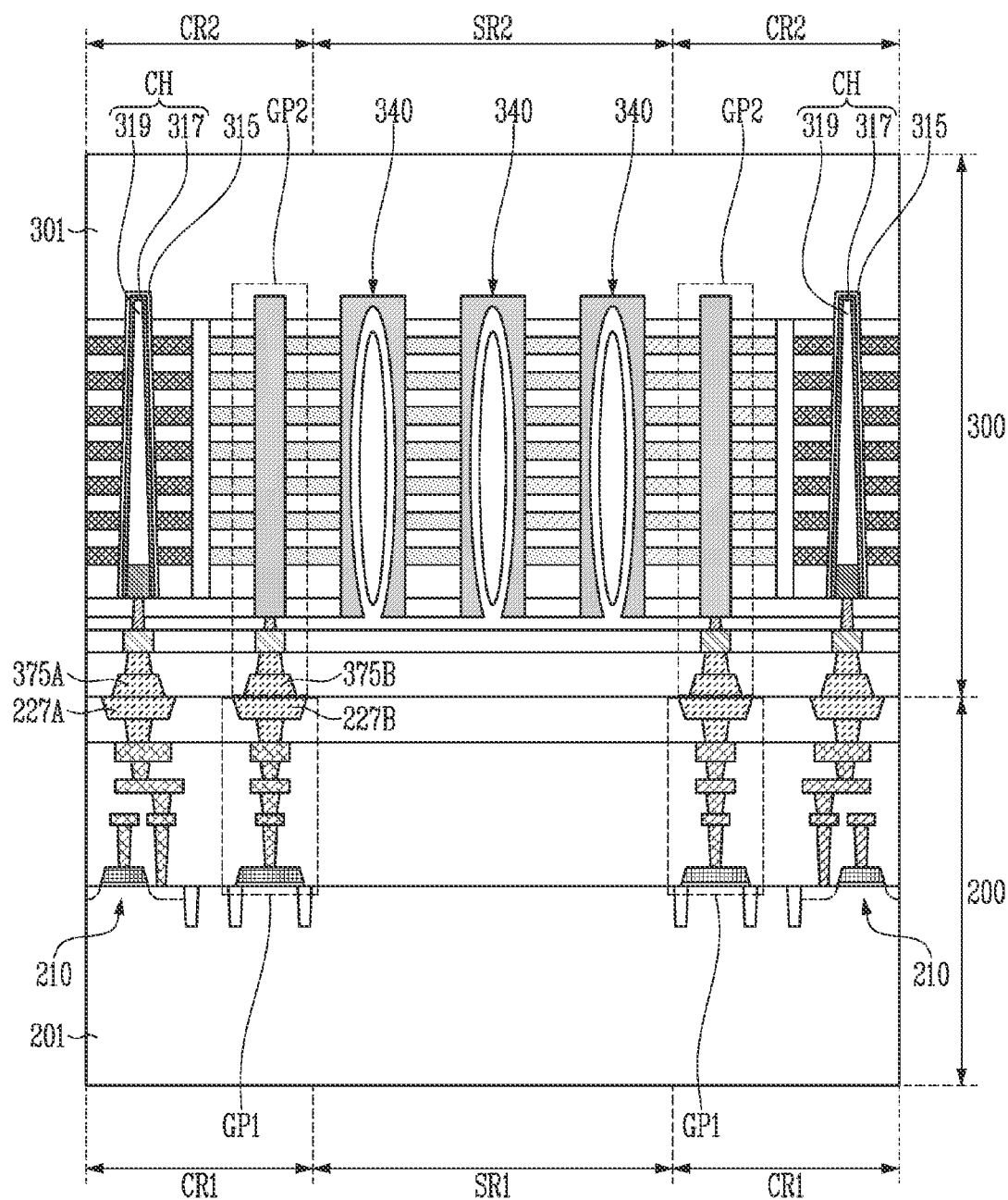
FIGS. 11A, 11B, 11C, 11D, 11E, 11F, 11G, and 11H are cross-sectional diagrams illustrating an embodiment of subsequent processes performed after the first circuit structure shown in FIG. 6 and the second circuit structure shown in FIG. 9 are provided.

Referring to FIG. 11A, the first circuit structure 200 and the second circuit structure 300 may be electrically coupled to each other by a bonding process.

The bonding process may be performed by aligning the first circuit structure 200 and the second circuit structure 300 so that the second conductive pattern 227A of the first circuit structure 200 and the fourth conductive pattern 375A of the second circuit structure 300 may face each other. The first chip region CR1 of the semiconductor substrate 201 may overlap the second chip region CR2 of the support substrate 301. The first scribe region SR1 of the semiconductor substrate 201 may overlap the second scribe region SR2 of the support substrate 301.

The second conductive pattern 227A of the first circuit structure 200 and the fourth conductive pattern 375A of the second circuit structure 300 may be bonded to each other by a bonding process. As the second conductive pattern 227A and the fourth conductive pattern 375A are bonded to each other, the channel layer 317 of the channel structure CH may be electrically connected to the transistor 210 of the peripheral circuit.

By the bonding process, the fourth chip guard pattern 227B of the chip guard patterns GP1 of the first group and the ninth chip guard pattern 375B of the chip guard patterns GP2 of the second group may be bonded to each other. Therefore, the first group of the chip guard patterns GP1 of the first circuit structure 200 and the second group of the chip guard patterns GP2 of the second circuit structure 300 may be electrically coupled to each other.

The first scribe region SR1 of the semiconductor substrate 201 may overlap the dummy patterns 340.

Figure 11B:
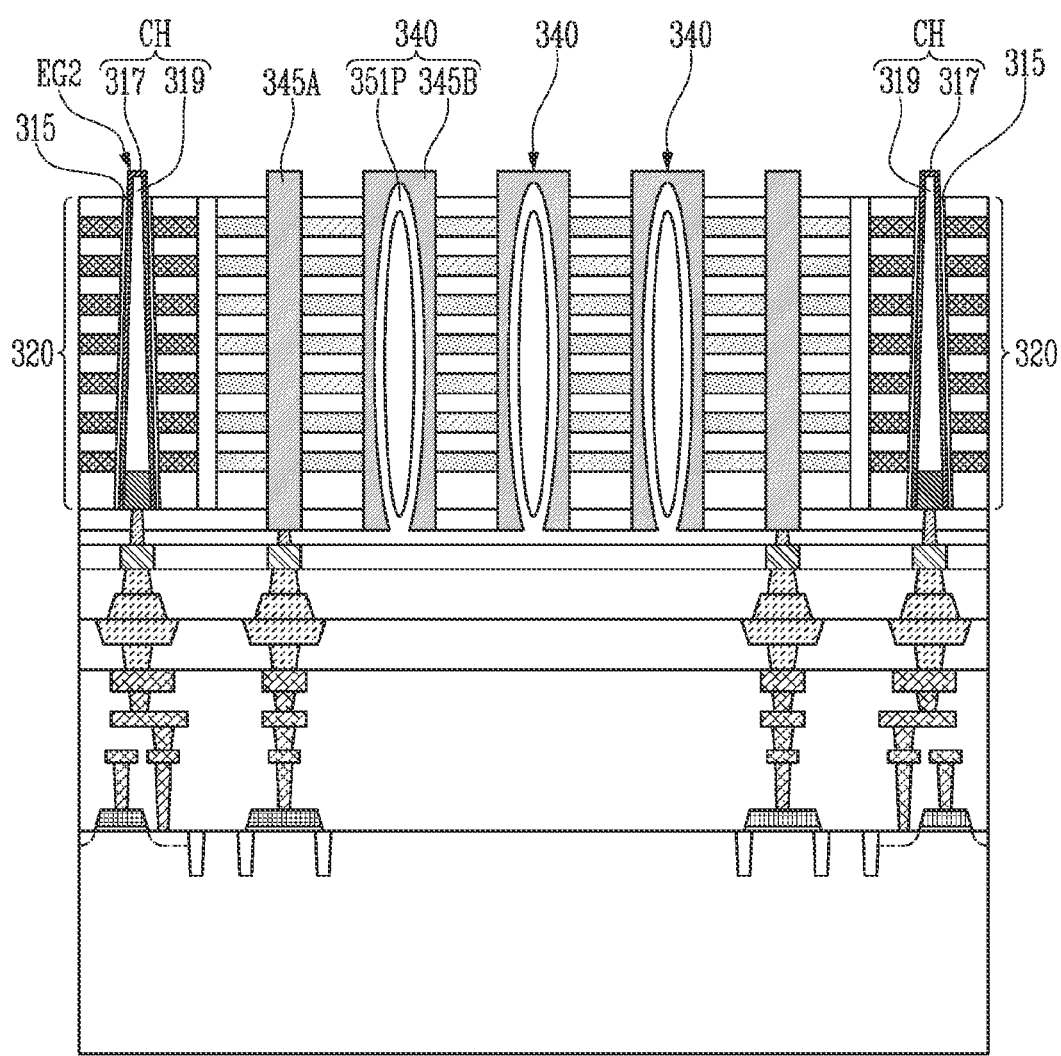

Referring to FIG. 11B, the support substrate 301 may be removed to expose the memory layer 315 as shown in FIG. 11A. As the support substrate 301 is removed, the end portion of the fifth chip guard pattern 345A may be exposed. In addition, as the support substrate 301 is removed, the end portion of the dummy metal layer 345B of each of the dummy patterns 340 may be exposed.

Subsequently, as a portion of the exposed memory layer 315 is removed, the second end portion EG2 of the channel layer 317 may be exposed. The memory layer 315 may remain between the gate stacked structure 320 and the channel layer 317.

Figure 11C:
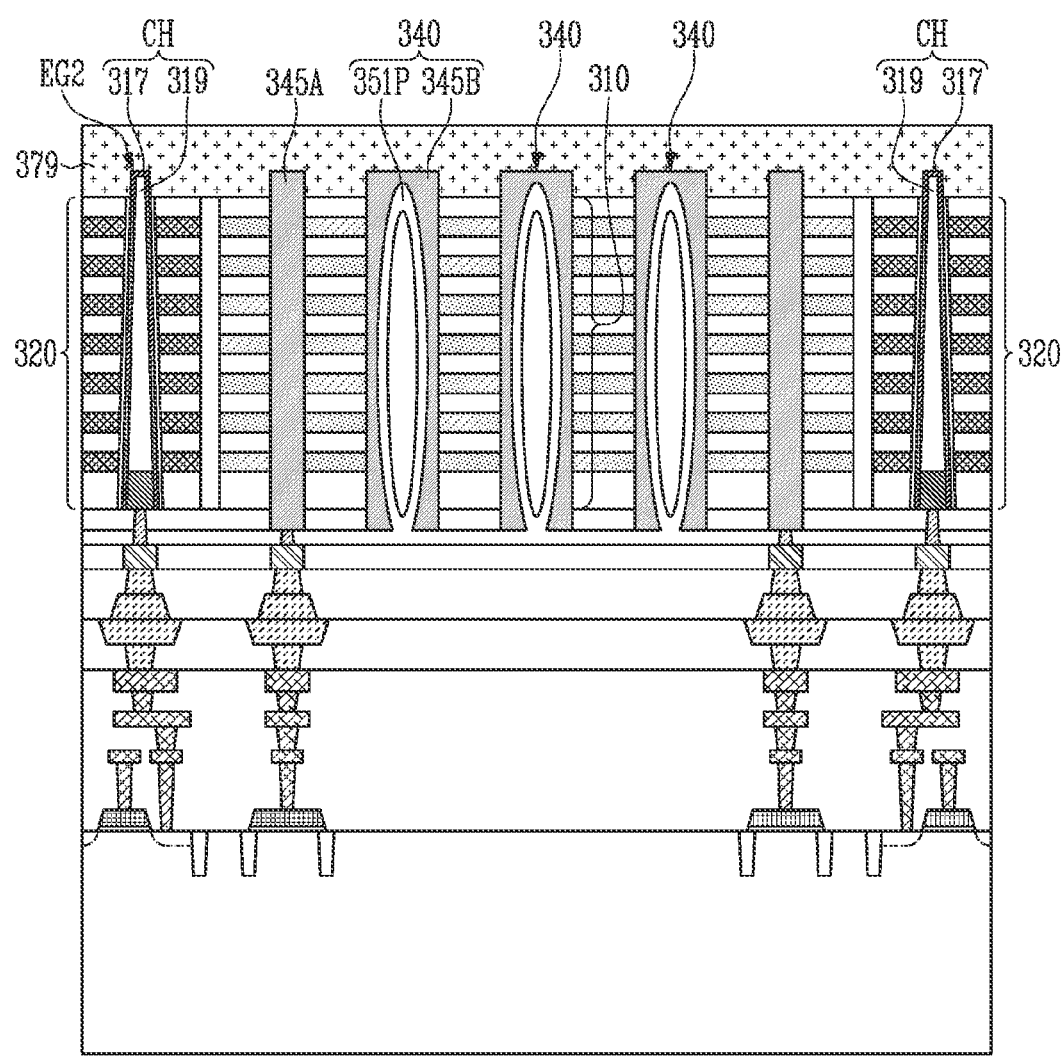

Referring to FIG. 11C, a conductive layer 379 that contacts the second end portion EG2 of the channel layer 317 may be formed. The conductive layer 379 may include a doped semiconductor layer. The conductive layer 379 may extend to cover the gate stacked structure 320, the dummy stacked structure 310, the fifth chip guard pattern 345A and the dummy metal layer 345B.

Figure 11D:
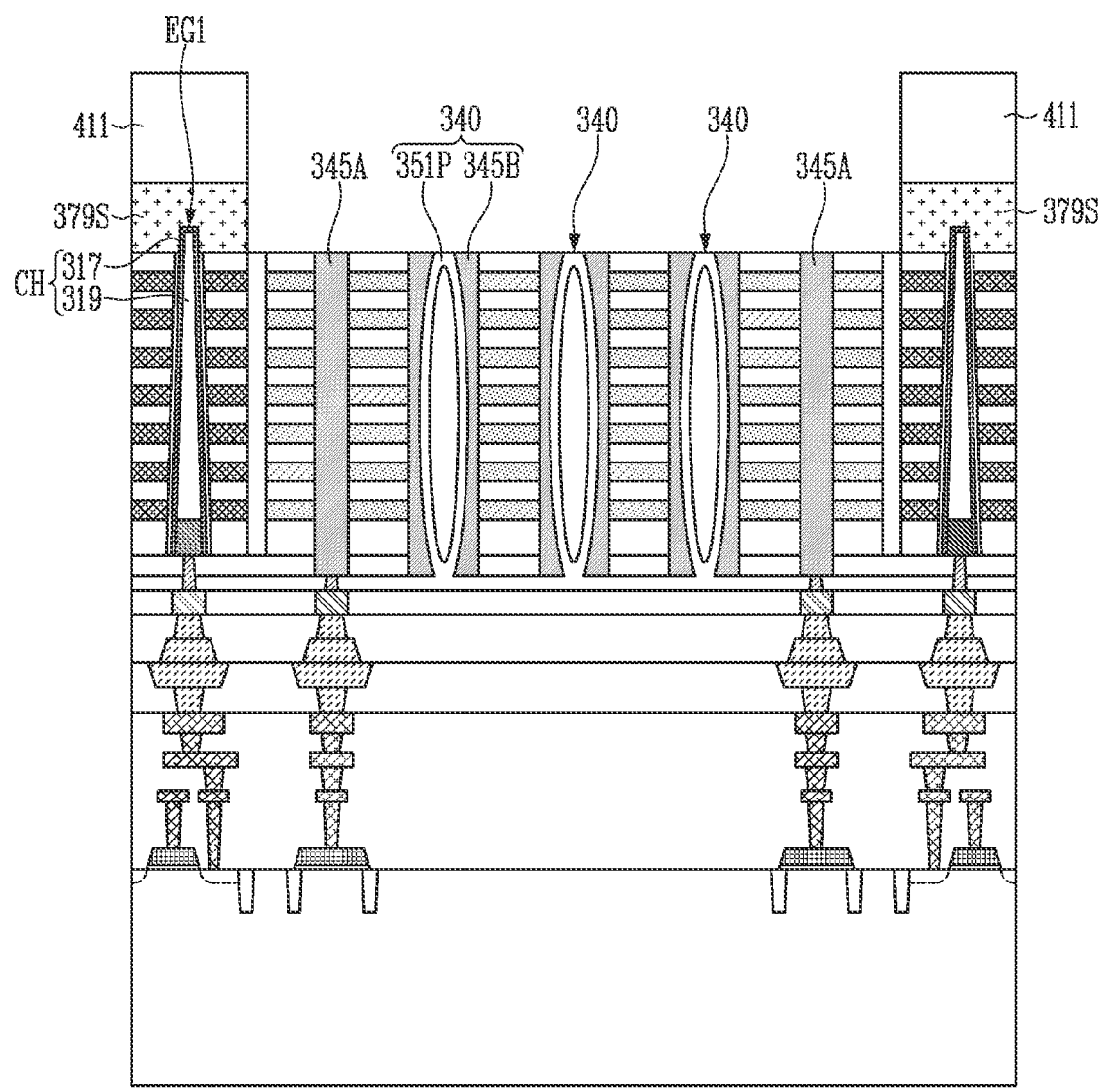

Referring to FIG. 11D, a mask pattern 411 may be formed on the conductive layer 379 as shown in FIG. 11C. The mask pattern 411 may be defined to open the fifth chip guard pattern 345A and the dummy patterns 340.

Subsequently, by removing a portion of the conductive layer 379 as shown in FIG. 11C by using the mask pattern 411 as an etch barrier, the fifth chip guard pattern 345A and the dummy patterns 340 may be exposed. The remaining conductive layer may be defined as a source layer 379S. The source layer 379S may remain while the source layer 379S contacts the second end portion EG2 of the channel layer 317.

While the portion of the conductive layer 379 is removed, the fifth chip guard pattern 345A and the dummy metal layer 345B may be partially etched. As a result, the dummy insulating layer 351P of each of the dummy patterns 340 may be exposed.

After the source layer 379S is formed, the mask pattern 411 may be removed.

Figure 11E:
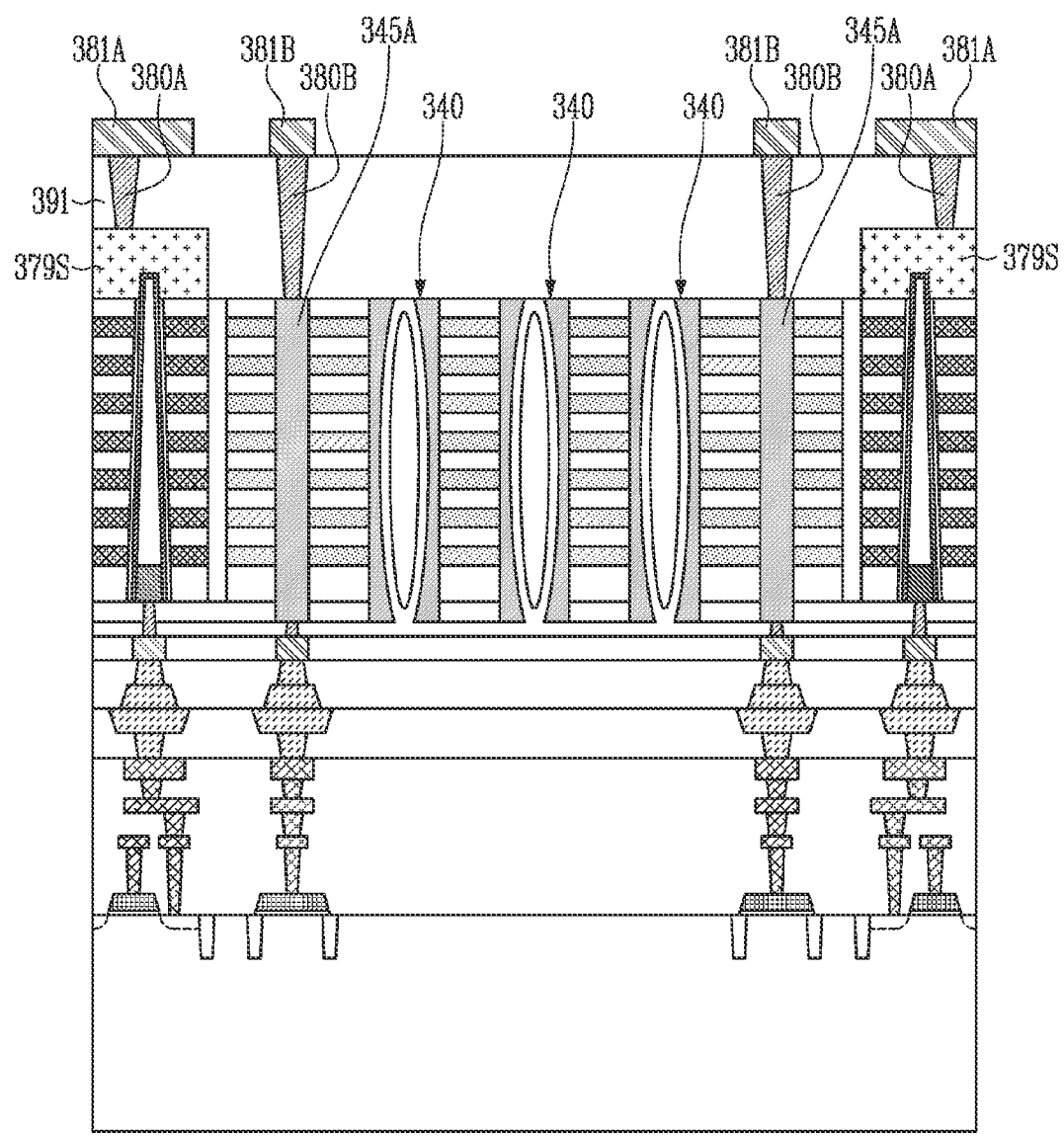

Referring to FIG. 11E, an upper insulating layer 391 may be formed. The upper insulating layer 391 may extend to cover the source layer 379S, the fifth chip guard pattern 345A and the dummy patterns 340. Subsequently, a source contact 380A that passes through the upper insulating layer 391 may be formed. The source contact 380A may contact the source layer 379S.

A 10th chip guard pattern 380B that passes through the upper insulating layer 391 may be formed while the source contact 380A is formed. The 10th chip guard pattern 380B may contact the fifth chip guard pattern 345A.

Subsequently, an upper wire 381A may be formed on the upper insulating layer 391. The upper wire 381A may contact the source contact 380A and be connected to the source layer 379S through the source contact 380A.

While the upper wire 381A is formed, an 11th chip guard pattern 381B may be formed. The 11th chip guard pattern 381B may contact the 10th chip guard pattern 380B and may be connected to the fifth chip guard pattern 345A through the 10th chip guard pattern 380B.

Figure 11F:
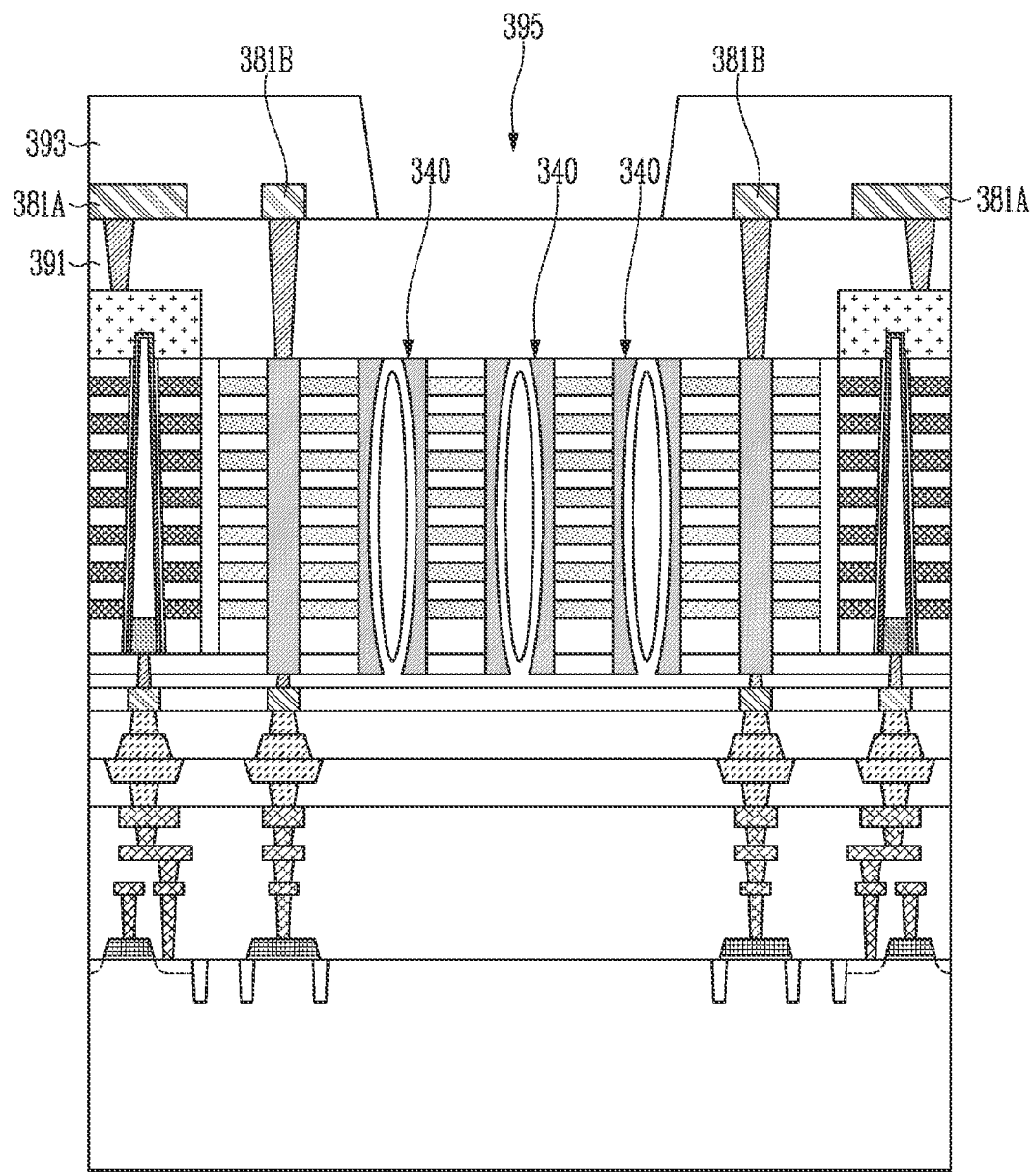

Referring to FIG. 11F, a protective layer 393 may be formed on the upper insulating layer 391. The protective layer 393 may include polyimide.

The protective layer 393 may extend to cover the upper wire 381A and the 11th chip guard pattern 381B. The protective layer 393 may include an opening 395 that opens a portion of the upper insulating layer 391 on the dummy patterns 340.

Figure 11G:
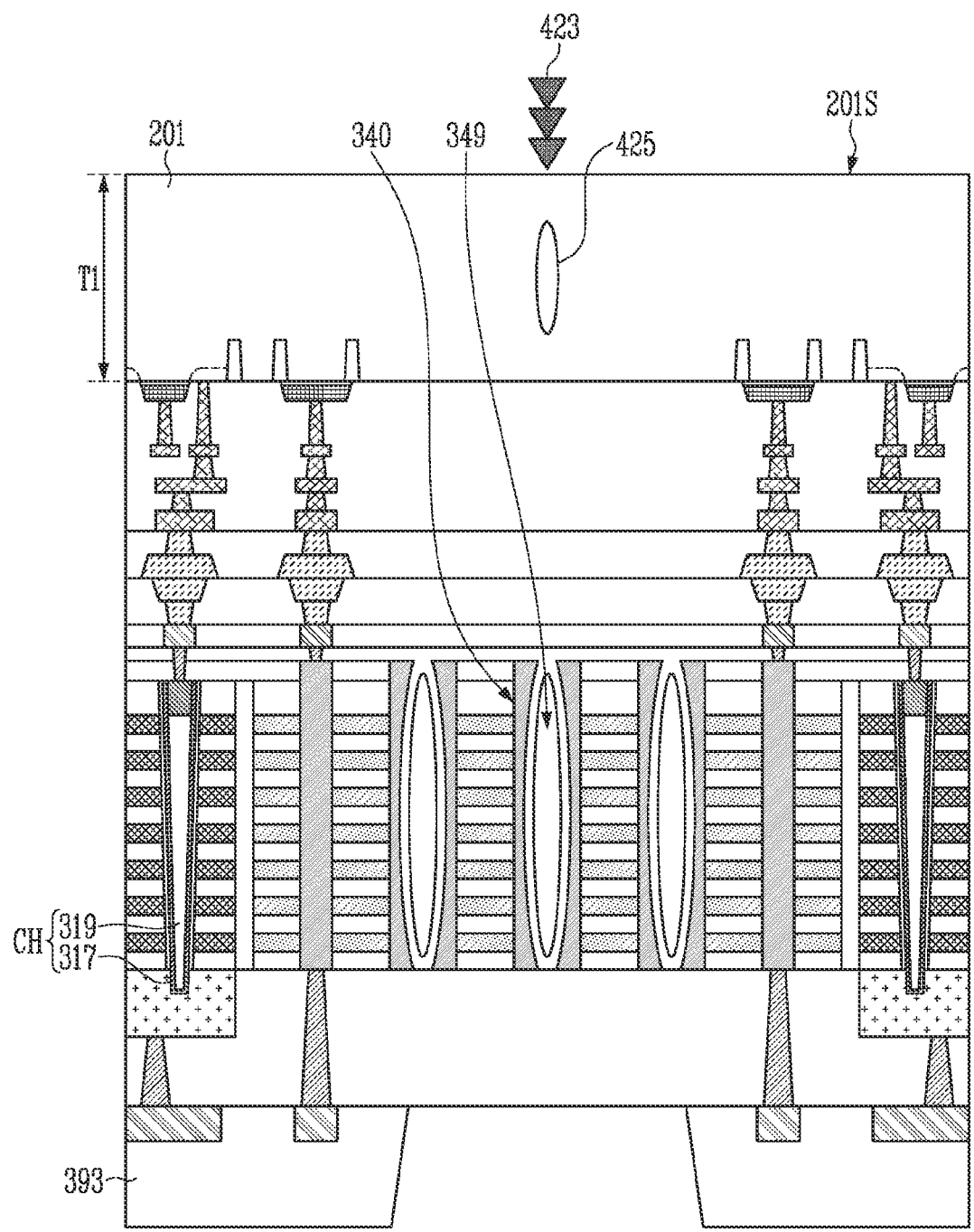

Referring to FIG. 11G, the semiconductor substrate 201 may include a rear surface 201S in a direction opposite to a direction toward the channel structure CH and may have a first thickness T1. The protective layer 393 may be fixed to a support tape (not shown) to expose the rear surface 201S of the semiconductor substrate 201.

Subsequently, a laser beam 423 may be irradiated onto the inside of the semiconductor substrate 201. The laser beam 423 may be irradiated into a region of the semiconductor substrate 201 that overlaps at least one of the dummy patterns 340. The laser beam 423 may be irradiated onto a region of the semiconductor substrate 201 that overlaps the air-gap 349 of the dummy pattern 340.

In a focusing area of the laser beam 423, defects may occur in the semiconductor substrate 201, and a cavity 425 may be defined.

Figure 11H:
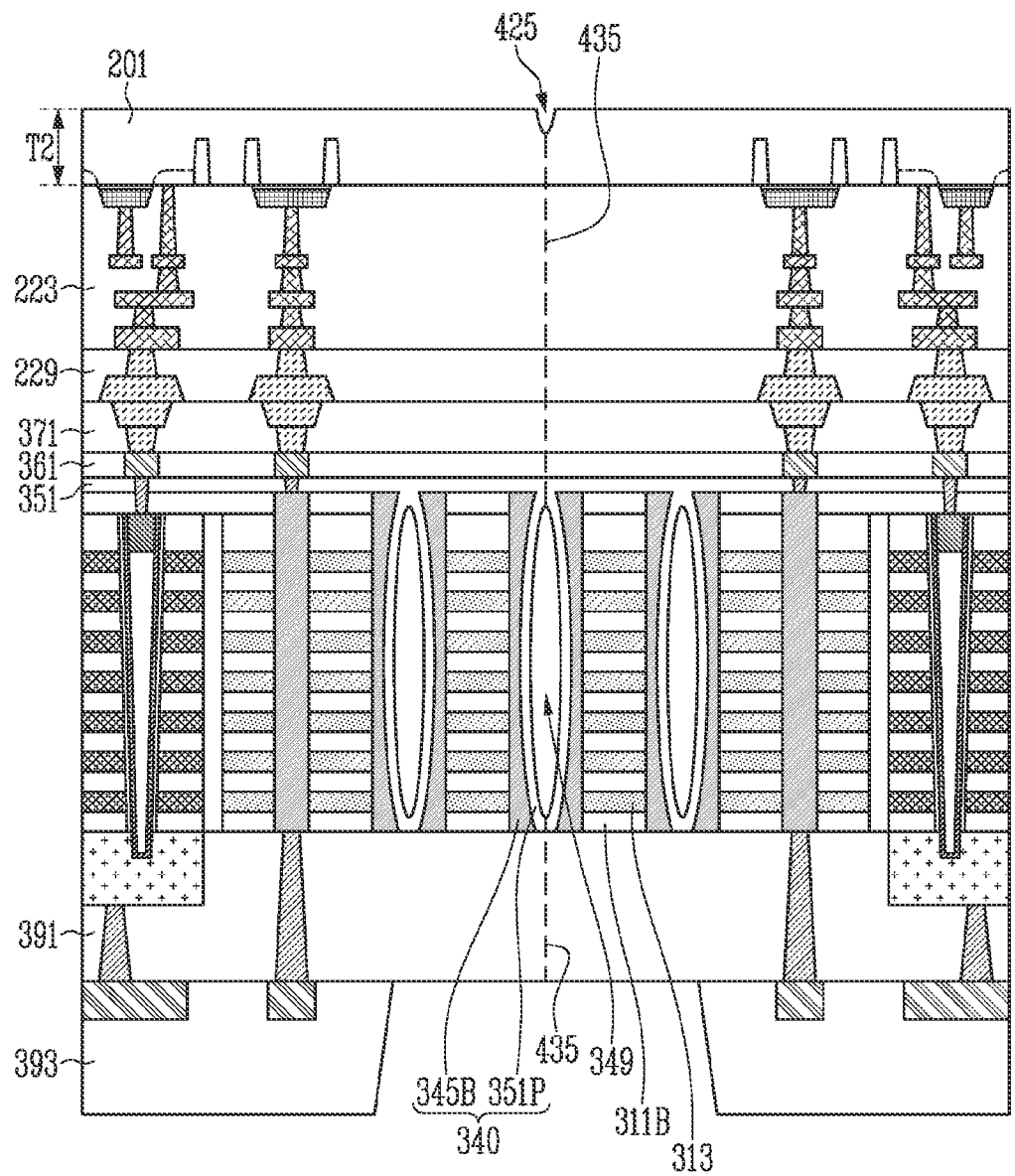

Referring to FIG. 11H, the semiconductor substrate 201 as shown in FIG. 11G may be reduced to a second thickness T2 less than a first thickness T1 by grinding a portion of the semiconductor substrate 201 from the rear surface of the semiconductor substrate 201. The portion of the semiconductor substrate 201 may be ground to expose the cavity 425. In addition, cracks 435 may be propagated from the cavity 425 by external pressure. The cracks 435 may be likely to be propagated toward the air-gap 349. Therefore, the cracks 435 may be propagated toward the upper insulating layer 391 overlapping the air-gap 349.

As described above, according to embodiments, as the cracks 435 are propagated using the air-gap 349, the semiconductor substrate 201, the first insulating structure 223, the second insulating structure 229, the third insulating structure 371, the insulating layers (e.g., 361 and 351), the upper insulating layer 391, the first material layers 311B, and the second material layers 313 may be separated into chip patterns. Therefore, separation defects may be mitigated or prevented from occurring in the chip patterns.

Embodiments are not limited to a manufacturing method to which a process of bonding a first circuit structure and a second circuit structure, which are separately formed, to each other is applied. According to another embodiment, a process of manufacturing a second circuit structures may be performed on a first circuit structure.

Figure 12:
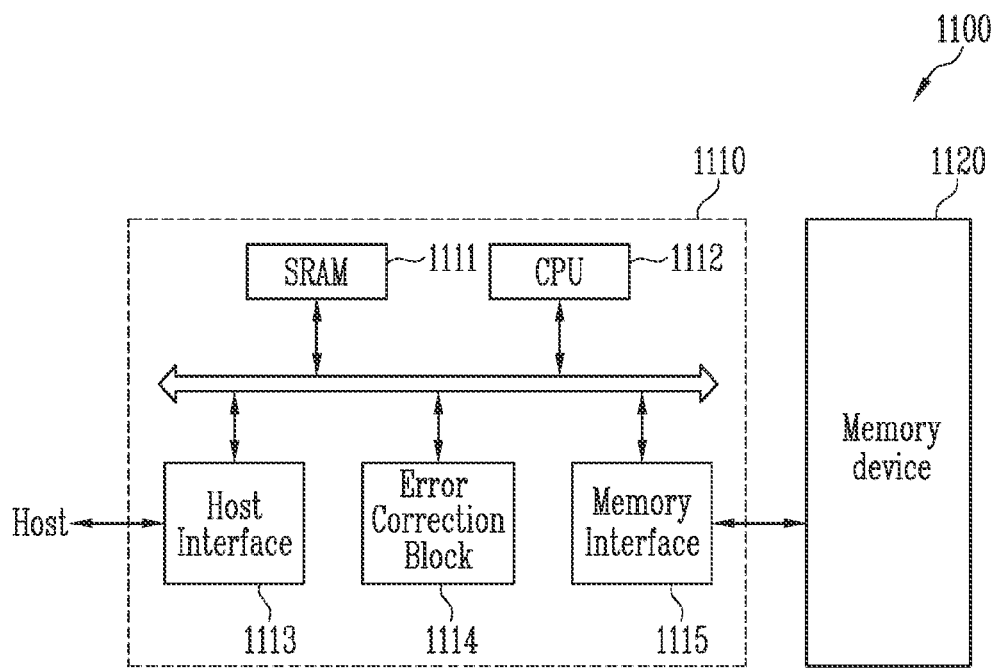
FIG. 12 is a block diagram illustrating the configuration of a memory system according to an embodiment of the present disclosure.

FIG. 12 is a block diagram illustrating the configuration of a memory system 1100 according to embodiment of the present disclosure.

Referring to FIG. 12, the memory system 1100 may include a memory device 1120 and a memory controller 1110.

The memory device 1120 may include a gate stacked structure penetrated by a channel layer, a dummy stacked structure opposing the gate stacked structure, a dummy pattern passing through the dummy stacked structure, and a gap, for example, an air-gap disposed in the dummy pattern.

The memory device 1120 may be a multi-chip package composed of a plurality of flash memory chips.

The memory controller 1110 may be configured to control the memory device 1120 and may include static random access memory (SRAM) 1111, a CPU 1112, a host interface 1113, an error correction code (ECC) circuit 1114, and a memory interface 1115. The SRAM 1111 may serve as an operation memory of the CPU 1112, the CPU 1112 may perform a control operation for data exchange of the memory controller 1110, and the host interface 1113 may include a data exchange protocol of a host accessing the memory system 1100. In addition, the ECC circuit 1114 may detect and correct errors included in the data read from the memory device 1120, and the memory interface 1115 may perform interfacing with the memory device 1120. The memory controller 1110 may further include read-only memory (ROM) that stores code data to interface with the host.

Figure 13:
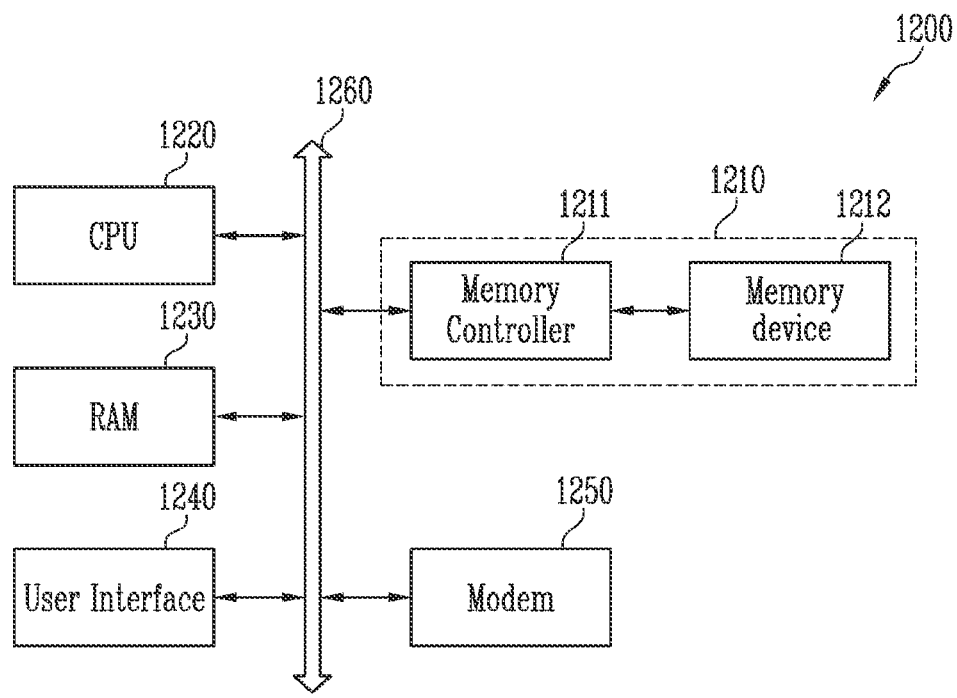
FIG. 13 is a block diagram illustrating the configuration of a computing system according to an embodiment of the present disclosure.

FIG. 13 is a block diagram illustrating the configuration of a computing system 1200 according to embodiment of the present disclosure.

Referring to FIG. 13, the computing system 1200 may include a CPU 1220, Random Access Memory (RAM) 1230, a user interface 1240, a modem 1250, and a memory system 1210 that are electrically coupled to a system bus 1260.

The memory system 1210 may include a memory device 1212 and a memory controller 1211. The memory device 1212 may include a gate stacked structure penetrated by a channel layer, a dummy stacked structure opposing the gate stacked structure, a dummy pattern passing through the dummy stacked structure, and a gap, for example, an air-gap disposed in the dummy pattern. The memory controller 1211 may be configured to control the memory device 1212.

According to the present disclosure, the stability of processes of separating chip patterns using a gap, for example, an air-gap may be improved.

What is claimed is:

1. A semiconductor memory device, comprising:
   a circuit structure including a semiconductor substrate;
   a gate stacked structure over the circuit structure;
   a channel layer passing through the gate stacked structure in a vertical direction;
   a memory layer disposed between the channel layer and the gate stacked structure;
   a dummy stacked structure over the semiconductor substrate and adjacent to the gate stacked structure;
   a first dummy pattern passing through the dummy stacked structure in the vertical direction;
   a gap arranged in the first dummy pattern; and
   a second dummy pattern arranged farther away from the gate stacked structure than the first dummy pattern and extending in the vertical direction,
   wherein the second dummy pattern extends along an outer sidewall of the dummy stacked structure and is closer to an edge of the semiconductor substrate than the dummy stacked structure.

2. The semiconductor memory device of claim 1, further comprising a chip guard pattern passing through the dummy stacked structure in the vertical direction and arranged closer to the gate stacked structure than the first dummy pattern.

3. The semiconductor memory device of claim 2, wherein the chip guard pattern and the first dummy pattern extend to surround a memory cell array including the gate stacked structure, the channel layer and the memory layer.

4. The semiconductor memory device of claim 2, wherein a width of the first dummy pattern is greater than a width of the chip guard pattern.

5. The semiconductor memory device of claim 1, wherein the first dummy pattern comprises:
   an insulating layer surrounding the gap; and
   a metal layer between the insulating layer and the dummy stacked structure.

6. The semiconductor memory device of claim 1, wherein the gap extends in the vertical direction.

7. The semiconductor memory device of claim 1, wherein the dummy stacked structure includes first material layers and second material layers stacked alternately with each other in the vertical direction, and
   the gate stacked structure includes interlayer insulating layers and conductive patterns stacked alternately with each other in the vertical direction.

8. The semiconductor memory device of claim 1, wherein the second dummy pattern comprises:
   a metal layer formed on the outer sidewall of the dummy stacked structure; and
   an insulating layer formed on a sidewall of the metal layer.

9. A method of manufacturing a semiconductor memory device, the method comprising:
   stacking first material layers and second material layers alternately on a support substrate including a chip region and a scribe region;
   forming a dummy groove passing through the first material layers and the second material layers to expose the support substrate in the scribe region;
   forming a dummy pattern in the dummy groove to define a gap in a central area of the dummy groove;
   forming a circuit structure including a semiconductor substrate;
   overlapping the support substrate with the semiconductor substrate so that the dummy pattern is disposed between the semiconductor substrate and the support substrate;
   removing the support substrate;
   forming a cavity inside the semiconductor substrate, wherein the cavity overlaps the gap in the dummy pattern spaced apart from the cavity; and
   propagating cracks from the cavity to the gap in the dummy pattern thereby separating the first material layers and the second material layers into chip patterns.

10. The method of claim 9, further comprising:
    forming a guard groove passing through the first material layers and the second material layers to expose the support substrate in the chip region, the guard groove having a smaller width than the dummy groove; and
    forming a chip guard pattern filling the guard groove.

11. The method of claim 10, wherein the forming of the chip guard pattern comprises filling the guard groove with a metal layer.

12. The method of claim 11, wherein the forming of the dummy pattern comprises:
    forming the metal layer on a surface of the dummy groove by using the filling of the guard groove with the metal layer; and
    forming an insulating layer on a surface of the metal layer in the dummy groove to define the gap in the dummy groove.

13. The method of claim 9, further comprising:
    forming a channel layer passing through the first material layers and the second material layers, extending into the support substrate in the chip region, and surrounded by a memory layer;
    removing a portion of the memory layer to expose an end portion of the channel layer after the removing of the support substrate;
    forming a conductive layer contacting the end portion of the channel layer;
    etching a portion of the conductive layer to expose the dummy pattern such that the conductive layer remains as a source layer contacting the end portion of the channel layer; and
    forming an upper insulating layer covering the dummy pattern and the source layer.

14. The method of claim 13, further comprising, before exposing the cavity before propagating the cracks from the cavity to the gap in the dummy pattern:
- exposing the cavity by grinding a rear surface of the semiconductor substrate in a direction opposite to a direction toward the channel layer,
- wherein the forming of the cavity inside the semiconductor substrate comprises irradiating a laser beam onto an inside of the semiconductor substrate overlapping the gap, and
- wherein the cracks are propagated into the upper insulating layer.

\* \* \* \* \*